(12) United States Patent
Lin et al.

(10) Patent No.: US 11,291,146 B2
(45) Date of Patent: Mar. 29, 2022

(54) LEADFRAME SUBSTRATE HAVING MODULATOR AND CRACK INHIBITING STRUCTURE AND FLIP CHIP ASSEMBLY USING THE SAME

(71) Applicant: BRIDGE SEMICONDUCTOR CORP., Taipei (TW)

(72) Inventors: Charles W. C. Lin, Singapore (SG); Chia-Chung Wang, Hsinchu County (TW)

(73) Assignee: BRIDGE SEMICONDUCTOR CORP., Taipei (TW)

( * ) Notice: Subject to any disclaimer, the term of this patent is extended or adjusted under 35 U.S.C. 154(b) by 621 days.

(21) Appl. No.: 16/279,696

(22) Filed: Feb. 19, 2019

(65) Prior Publication Data

US 2019/0182997 A1 Jun. 13, 2019

Related U.S. Application Data

(60) Continuation-in-part of application No. 16/046,243, filed on Jul. 26, 2018, now abandoned, which is a
(Continued)

(51) Int. Cl.
*H05K 13/00* (2006.01)
*H05K 1/02* (2006.01)
(Continued)

(52) U.S. Cl.
CPC ......... *H05K 13/00* (2013.01); *H01L 21/4857* (2013.01); *H01L 21/568* (2013.01);
(Continued)

(58) Field of Classification Search
CPC .. H05K 13/00; H05K 1/0204; H05K 13/0469; H05K 13/0486;
(Continued)

(56) References Cited

U.S. PATENT DOCUMENTS

| 4,510,519 A | 4/1985 | Dubois et al. |
| 5,074,759 A | 12/1991 | Cossairt |

(Continued)

FOREIGN PATENT DOCUMENTS

| JP | 2005294352 A | 10/2005 |
| JP | 2008274046 A | 11/2008 |

(Continued)

OTHER PUBLICATIONS

Office Action issued in corresponding KR patent application No. 10-2019-0048742dated Aug. 1, 2020.

*Primary Examiner* — Michael N Orlando
*Assistant Examiner* — Abhishek A Patwardhan
(74) *Attorney, Agent, or Firm* — Muncy, Geissler, Olds & Lowe, P.C.

(57) ABSTRACT

The leadframe substrate mainly includes a modulator, a plurality of metal leads, a resin layer and a crack inhibiting structure. The resin layer provides mechanical bonds between the modulator and the metal leads disposed about peripheral sidewalls of the modulator. The crack inhibiting structure includes a continuous interlocking fiber sheet that covers the modulator/resin interfaces, so that the segregation induced along the modulator/resin interfaces or cracks formed within the resin layer can be prevented or restrained from extending to the top surfaces, thereby ensuring the signal integrity of the flip chip assembly.

10 Claims, 16 Drawing Sheets

Related U.S. Application Data continuation-in-part of application No. 15/976,307, filed on May 10, 2018, now abandoned, application No. 16/279,696, which is a continuation-in-part of application No. 15/976,307, filed on May 10, 2018, now abandoned, and a continuation-in-part of application No. 15/908,838, filed on Mar. 1, 2018, now abandoned, said application No. 16/046,243 is a continuation-in-part of application No. 15/908,838, filed on Mar. 1, 2018, now abandoned, and a continuation-in-part of application No. 15/881,119, filed on Jan. 26, 2018, now abandoned, application No. 16/279,696, which is a continuation-in-part of application No. 15/881,119, filed on Jan. 26, 2018, now abandoned, and a continuation-in-part of application No. 15/785,426, filed on Oct. 16, 2017, now abandoned, which is a continuation-in-part of application No. 15/642,256, filed on Jul. 5, 2017, now abandoned, application No. 16/279,696, which is a continuation-in-part of application No. 15/642,253, filed on Jul. 5, 2017, now abandoned, said application No. 15/908,838 is a continuation-in-part of application No. 15/642,253, filed on Jul. 5, 2017, now abandoned, said application No. 16/046,243 is a continuation-in-part of application No. 15/642,253, filed on Jul. 5, 2017, now abandoned, application No. 16/279,696, which is a continuation-in-part of application No. 15/605,920, filed on May 25, 2017, now abandoned, said application No. 15/881,119 is a continuation-in-part of application No. 15/605,920, filed on May 25, 2017, now abandoned, said application No. 16/046,243 is a continuation-in-part of application No. 15/605,920, filed on May 25, 2017, now abandoned, said application No. 15/908,838 is a continuation-in-part of application No. 15/473,629, filed on Mar. 30, 2017, now Pat. No. 10,134,711, which is a continuation-in-part of application No. 15/462,536, filed on Mar. 17, 2017, now abandoned, and a continuation-in-part of application No. 15/415,844, filed on Jan. 25, 2017, now abandoned, and a continuation-in-part of application No. 15/415,846, filed on Jan. 25, 2017, now abandoned, said application No. 15/908,838 is a continuation-in-part of application No. 15/415,844, filed on Jan. 25, 2017, now abandoned, and a continuation-in-part of application No. 15/415,846, filed on Jan. 25, 2017, now abandoned, said application No. 15/415,844 is a continuation-in-part of application No. 15/353,537, filed on Nov. 16, 2016, now Pat. No. 10,354,984, said application No. 15/415,846 is a continuation-in-part of application No. 15/353,537, filed on Nov. 16, 2016, now Pat. No. 10,354,984, said application No. 15/462,536 is a continuation-in-part of application No. 15/353,537, filed on Nov. 16, 2016, now Pat. No. 10,354,984, said application No. 15/473,629 is a continuation-in-part of application No. 15/353,537, filed on Nov. 16, 2016, now Pat. No. 10,354,984, and a continuation-in-part of application No. 15/289,126, filed on Oct. 8, 2016, now abandoned, said application No. 15/462,536 is a continuation-in-part of application No. 15/289,126, filed on Oct. 8, 2016, now abandoned, said application No. 15/415,846 is a continuation-in-part of application No. 15/289,126, filed on Oct. 8, 2016, now abandoned, said application No. 15/415,844 is a continuation-in-part of application No. 15/289,126, filed on Oct. 8, 2016, now abandoned, said application No. 15/353,537 is a continuation-in-part of application No. 15/289,126, filed on Oct. 8, 2016, now abandoned, said application No. 15/415,844 is a continuation-in-part of application No. 15/166,185, filed on May 26, 2016, now Pat. No. 10,121,768, said application No. 15/462,536 is a continuation-in-part of application No. 15/166,185, filed on May 26, 2016, now Pat. No. 10,121,768, said application No. 15/415,846 is a continuation-in-part of application No. 15/166,185, filed on May 26, 2016, now Pat. No. 10,121,768, said application No. 15/289,126 is a continuation-in-part of application No. 15/166,185, filed on May 26, 2016, now Pat. No. 10,121,768, said application No. 15/473,629 is a continuation-in-part of application No. 15/166,185, filed on May 26, 2016, now Pat. No. 10,121,768, said application No. 15/353,537 is a continuation-in-part of application No. 15/166,185, filed on May 26, 2016, now Pat. No. 10,121,768, said application No. 16/046,243 is a continuation-in-part of application No. 15/080,427, filed on Mar. 24, 2016, now abandoned, said application No. 15/642,253 is a continuation-in-part of application No. 14/846,987, filed on Sep. 7, 2015, now Pat. No. 10,420,204, application No. 16/279,696, which is a continuation-in-part of application No. 14/846,987, filed on Sep. 7, 2015, now Pat. No. 10,420,204, said application No. 15/605,920 is a continuation-in-part of application No. 14/846,987, filed on Sep. 7, 2015, now Pat. No. 10,420,204, said application No. 15/881,119 is a continuation-in-part of application No. 14/846,987, filed on Sep. 7, 2015, now Pat. No. 10,420,204, said application No. 15/080,427 is a continuation-in-part of application No. 14/846,987, filed on Sep. 7, 2015, now Pat. No. 10,420,204, said application No. 16/046,243 is a continuation-in-part of application No. 14/846,987, filed on Sep. 7, 2015, now Pat. No. 10,420,204, said application No. 15/642,253 is a continuation-in-part of application No. 14/621,332, filed on Feb. 12, 2015, now abandoned, said application No. 15/881,119 is a continuation-in-part of application No. 14/621,332, filed on Feb. 12, 2015, now abandoned, said application No. 14/846,987 is a continuation-in-part of application No. 14/621,332, filed on Feb. 12, 2015, now abandoned, said application No. 15/080,427 is a continuation-in-part of application No. 14/621,332, filed on Feb. 12, 2015, now abandoned, said application No. 15/605,920 is a continuation-in-part of application No. 14/621,332, filed on Feb. 12, 2015, now abandoned, said application No. 15/976,307 is a division of application No. 14/621,332, filed on Feb. 12, 2015, now abandoned.

(60) Provisional application No. 62/166,771, filed on May 27, 2015, provisional application No. 61/949,652, filed on Mar. 7, 2014.

(51) Int. Cl.

| | | |
|---|---|---|
| *H01L 21/56* | (2006.01) | |
| *H01L 23/498* | (2006.01) | |
| *H01L 21/48* | (2006.01) | |
| *H05K 13/04* | (2006.01) | |
| *H01L 23/367* | (2006.01) | |
| *H01L 23/31* | (2006.01) | |

|   |   |   |
|---|---|---|
| *H01L 23/00* | (2006.01) | |
| *H01L 23/495* | (2006.01) | |

(52) U.S. Cl.
 CPC .... *H01L 23/3677* (2013.01); *H01L 23/49822* (2013.01); *H01L 23/49827* (2013.01); *H01L 23/49838* (2013.01); *H01L 23/49861* (2013.01); *H05K 1/0204* (2013.01); *H05K 13/0469* (2013.01); *H05K 13/0486* (2013.01); *H01L 23/3121* (2013.01); *H01L 23/49541* (2013.01); *H01L 23/49548* (2013.01); *H01L 23/562* (2013.01); *H01L 24/16* (2013.01); *H01L 24/32* (2013.01); *H01L 24/73* (2013.01); *H01L 24/92* (2013.01); *H01L 2224/13101* (2013.01); *H01L 2224/13144* (2013.01); *H01L 2224/16227* (2013.01); *H01L 2224/16245* (2013.01); *H01L 2224/18* (2013.01); *H01L 2224/73204* (2013.01); *H01L 2224/92125* (2013.01); *H01L 2924/00014* (2013.01); *H01L 2924/15174* (2013.01); *H01L 2924/15311* (2013.01); *H01L 2924/3511* (2013.01); *H05K 2201/0187* (2013.01); *H05K 2201/10106* (2013.01); *H05K 2203/025* (2013.01); *H05K 2203/063* (2013.01)

(58) Field of Classification Search
 CPC . H05K 2201/0187; H05K 2201/10106; H05K 2203/025; H05K 2203/063; H01L 21/4857; H01L 21/568; H01L 23/3677; H01L 23/49822; H01L 23/49827; H01L 23/49838; H01L 23/49861; H01L 23/3121; H01L 23/49541; H01L 23/49548; H01L 23/562; H01L 24/16; H01L 24/32; H01L 24/73; H01L 24/92; H01L 2224/13101; H01L 2224/13144; H01L 2224/16227; H01L 2224/16245; H01L 2224/18; H01L 2224/73204; H01L 2224/92125; H01L 2924/00014; H01L 2924/15174; H01L 2924/15311; H01L 2924/3511

See application file for complete search history.

(56) References Cited

U.S. PATENT DOCUMENTS

| | | | |
|---|---|---|---|
| 5,583,377 | A | 12/1996 | Higgins |
| 5,665,652 | A | 9/1997 | Shimizu |
| 5,710,457 | A * | 1/1998 | Uno .................. H01L 23/49506 257/666 |
| 5,767,573 | A * | 6/1998 | Noda ....................... H01L 24/06 257/675 |
| 5,790,384 | A | 8/1998 | Ahmad et al. |
| 5,801,072 | A | 9/1998 | Barber |
| 5,973,388 | A * | 10/1999 | Chew ................ H01L 23/49562 257/666 |
| 5,977,640 | A | 11/1999 | Bertin et al. |
| 6,084,308 | A | 7/2000 | Kelkar et al. |
| 6,091,138 | A | 7/2000 | Yu et al. |
| 6,150,724 | A | 11/2000 | Wenzel et al. |
| 6,204,562 | B1 | 3/2001 | Ho et al. |
| 6,285,075 | B1 * | 9/2001 | Combs ................ H01L 23/4334 257/675 |
| 6,326,696 | B1 | 12/2001 | Horton et al. |
| 6,365,963 | B1 | 4/2002 | Shimada |
| 6,369,448 | B1 | 4/2002 | McCormick |
| 6,376,917 | B1 | 4/2002 | Takeshita et al. |
| 6,396,139 | B1 | 5/2002 | Huang |
| 6,432,742 | B1 | 8/2002 | Guan et al. |
| 6,495,910 | B1 | 12/2002 | Wu |
| 6,507,115 | B1 | 1/2003 | Hofstee et al. |
| 6,555,917 | B1 | 4/2003 | Heo |
| 6,563,205 | B1 | 5/2003 | Fogal et al. |
| 6,577,012 | B1 | 6/2003 | Greenwood et al. |
| 6,580,165 | B1 | 6/2003 | Singh |
| 6,586,836 | B1 | 7/2003 | Ma et al. |
| 6,593,545 | B1 | 7/2003 | Greenwood et al. |
| 6,659,512 | B1 | 12/2003 | Harper et al. |
| 6,696,747 | B1 | 2/2004 | Lee et al. |
| 6,709,898 | B1 | 3/2004 | Ma et al. |
| 6,768,208 | B2 | 7/2004 | Lin et al. |
| 6,828,220 | B2 | 12/2004 | Pendse et al. |
| 6,844,619 | B2 | 1/2005 | Tago |
| 6,858,919 | B2 | 2/2005 | Seo et al. |
| 6,861,750 | B2 | 3/2005 | Zhao et al. |
| 6,870,248 | B1 | 3/2005 | Shibata |
| 6,906,408 | B2 | 6/2005 | Cloud et al. |
| 6,953,988 | B2 | 10/2005 | Seo et al. |
| 6,984,544 | B2 | 1/2006 | Cloud et al. |
| 7,002,254 | B2 | 2/2006 | Harper et al. |
| 7,022,551 | B2 | 4/2006 | Wang et al. |
| 7,026,719 | B2 | 4/2006 | Wang |
| 7,049,684 | B2 | 5/2006 | Minamio et al. |
| 7,067,904 | B2 | 6/2006 | Wang et al. |
| 7,067,911 | B1 | 6/2006 | Lin et al. |
| 7,087,988 | B2 | 8/2006 | Hosomi |
| 7,102,214 | B1 | 9/2006 | Miks et al. |
| 7,164,202 | B2 | 1/2007 | Wang et al. |
| 7,198,980 | B2 | 4/2007 | Jiang et al. |
| 7,202,559 | B2 | 4/2007 | Zhao et al. |
| 7,205,646 | B2 | 4/2007 | Lin et al. |
| 7,218,005 | B2 | 5/2007 | Tago |
| 7,368,806 | B2 | 5/2008 | Lui et al. |
| 7,425,468 | B2 | 9/2008 | Wang et al. |
| 7,451,933 | B2 | 12/2008 | Zhao et al. |
| 7,554,194 | B2 | 6/2009 | Kelly et al. |
| 7,573,136 | B2 | 8/2009 | Jiang et al. |
| 7,592,689 | B2 | 9/2009 | Brunnbauer |
| 7,602,053 | B2 | 10/2009 | Huang et al. |
| 7,670,872 | B2 | 3/2010 | Yan |
| 7,679,172 | B2 | 3/2010 | Huang et al. |
| 7,723,163 | B2 | 5/2010 | Xu et al. |
| 7,781,264 | B2 | 8/2010 | Wu et al. |
| 7,790,512 | B1 | 9/2010 | Sirinorakul et al. |
| 7,859,120 | B2 | 12/2010 | Choi et al. |
| 7,919,853 | B1 | 4/2011 | Lee |
| 7,944,043 | B1 | 5/2011 | Chung et al. |
| 7,993,967 | B2 | 8/2011 | Jiang et al. |
| 8,003,415 | B2 | 8/2011 | Wang |
| 8,008,121 | B2 * | 8/2011 | Choi ....................... H01L 24/29 438/107 |
| 8,022,512 | B2 | 9/2011 | Romos et al. |
| 8,022,555 | B2 | 9/2011 | Hwang et al. |
| 8,035,216 | B2 | 10/2011 | Skeete |
| 8,063,470 | B1 | 11/2011 | Sirinorakul et al. |
| 8,089,159 | B1 | 1/2012 | Park et al. |
| 8,124,447 | B2 | 2/2012 | Chang Chien et al. |
| 8,129,229 | B1 | 3/2012 | Sirinorakul et al. |
| 8,143,097 | B2 | 3/2012 | Chi et al. |
| 8,148,806 | B2 | 4/2012 | Lin et al. |
| 8,188,379 | B2 | 5/2012 | Hsu |
| 8,227,904 | B2 | 7/2012 | Brannisch et al. |
| 8,241,967 | B2 | 8/2012 | Huang et al. |
| 8,247,269 | B1 | 8/2012 | Liu |
| 8,247,369 | B2 | 8/2012 | Chen et al. |
| 8,288,854 | B2 | 10/2012 | Weng et al. |
| 8,304,268 | B2 | 11/2012 | Lin et al. |
| 8,310,060 | B1 | 11/2012 | Nondhasittichai et al. |
| 8,354,741 | B2 | 1/2013 | Kang et al. |
| 8,390,118 | B2 | 3/2013 | Lin et al. |
| 8,415,780 | B2 | 4/2013 | Sun |
| 8,420,452 | B2 | 4/2013 | Pu et al. |
| 8,421,199 | B2 | 4/2013 | Lin et al. |
| 8,421,222 | B2 | 4/2013 | Lin et al. |
| 8,519,537 | B2 | 8/2013 | Jeng et al. |
| 8,525,317 | B1 | 9/2013 | Sutardja |
| 8,525,336 | B2 | 9/2013 | Lin et al. |
| 8,551,820 | B1 | 10/2013 | Foster et al. |
| 8,558,395 | B2 | 10/2013 | Khan et al. |
| 8,610,272 | B2 | 12/2013 | Huang et al. |
| 8,618,641 | B2 | 12/2013 | Chan et al. |

(56) References Cited

U.S. PATENT DOCUMENTS

| | | |
|---|---|---|
| 8,618,655 B2 | 12/2013 | Chen et al. |
| 8,624,368 B2 | 1/2014 | Tang et al. |
| 8,648,469 B2 | 2/2014 | Choi et al. |
| 8,686,558 B2 | 4/2014 | Zhao et al. |
| 8,816,482 B2 | 8/2014 | Sirinorakul et al. |
| 8,836,115 B1 | 9/2014 | St. Amand et al. |
| 8,859,908 B2 | 10/2014 | Wang et al. |
| 8,895,998 B2 | 11/2014 | Hussell et al. |
| 8,971,053 B2 | 3/2015 | Kariya et al. |
| 9,048,306 B2 | 6/2015 | Chi et al. |
| 9,185,791 B2 | 11/2015 | Wang |
| 9,196,575 B1 | 11/2015 | Lee et al. |
| 9,252,032 B2 | 2/2016 | Choi et al. |
| 9,252,130 B2 | 2/2016 | Kim et al. |
| 9,263,332 B2 | 2/2016 | Chi et al. |
| 9,281,300 B2 | 3/2016 | Merilo et al. |
| 9,305,897 B2 | 4/2016 | Choi et al. |
| 9,337,161 B2 | 5/2016 | Camacho et al. |
| 9,379,078 B2 | 6/2016 | Yu et al. |
| 9,385,095 B2 | 7/2016 | Jeng et al. |
| 9,515,010 B2 | 12/2016 | Xia et al. |
| 9,583,367 B2 | 2/2017 | Huang et al. |
| 9,706,639 B2 | 7/2017 | Lee |
| 9,805,956 B2 | 10/2017 | Xing et al. |
| 2002/0131229 A1 | 9/2002 | Jones et al. |
| 2004/0155325 A1 | 8/2004 | Ma et al. |
| 2006/0158804 A1 | 7/2006 | Usui et al. |
| 2008/0174981 A1 | 7/2008 | Chan et al. |
| 2008/0182360 A1 | 7/2008 | Lin et al. |
| 2010/0001395 A1 | 1/2010 | Wang et al. |
| 2010/0003787 A1 | 1/2010 | Wang et al. |
| 2010/0019377 A1 | 1/2010 | Arvelo et al. |
| 2010/0043942 A1 | 2/2010 | Tanaka et al. |
| 2010/0230805 A1 | 9/2010 | Refai-ahmed |
| 2011/0018114 A1 | 1/2011 | Pagaila et al. |
| 2011/0024888 A1 | 2/2011 | Pagaila et al. |
| 2012/0126401 A1* | 5/2012 | Lin ................ H01L 24/82 257/737 |
| 2012/0152605 A1 | 6/2012 | Das et al. |
| 2012/0229990 A1 | 9/2012 | Adachi et al. |
| 2012/0230001 A1 | 9/2012 | Takahasi et al. |
| 2013/0052775 A1 | 2/2013 | Kim et al. |
| 2013/0056862 A1 | 3/2013 | Kim et al. |
| 2013/0248234 A1 | 9/2013 | Inagaki et al. |
| 2014/0035892 A1 | 2/2014 | Shenoy et al. |
| 2014/0048955 A1 | 2/2014 | Lin et al. |
| 2014/0144677 A1 | 5/2014 | Wang et al. |
| 2014/0210107 A1 | 7/2014 | Zhai |
| 2014/0217610 A1 | 8/2014 | Jeng et al. |
| 2014/0251658 A1 | 9/2014 | Lin et al. |
| 2015/0118794 A1 | 4/2015 | Lin et al. |
| 2015/0123268 A1 | 5/2015 | Yu et al. |
| 2015/0235915 A1 | 8/2015 | Liang et al. |
| 2015/0303174 A1 | 10/2015 | Yu et al. |
| 2017/0301617 A1 | 10/2017 | Lin et al. |

FOREIGN PATENT DOCUMENTS

| | | |
|---|---|---|
| KR | 20140074701 A | 6/2014 |
| TW | 201407731 A | 2/2014 |
| TW | 201407733 A | 2/2014 |
| TW | 201422075 A | 6/2014 |

* cited by examiner

LEADFRAME SUBSTRATE HAVING MODULATOR AND CRACK INHIBITING STRUCTURE AND FLIP CHIP ASSEMBLY USING THE SAME

CROSS REFERENCE TO RELATED APPLICATIONS

This application is a continuation-in-part of U.S. application Ser. No. 16/046,243 filed Jul. 26, 2018, a continuation-in-part of U.S. application Ser. No. 14/846,987 filed Sep. 7, 2015, a continuation-in-part of U.S. application Ser. No. 15/605,920 filed May 25, 2017, a continuation-in-part of U.S. application Ser. No. 15/642,253 filed Jul. 5, 2017, a continuation-in-part of U.S. application Ser. No. 15/785,426 filed Oct. 16, 2017, a continuation-in-part of U.S. application Ser. No. 15/881,119 filed Jan. 26, 2018, a continuation-in-part of U.S. application Ser. No. 15/908,838 filed Mar. 1, 2018, and a continuation-in-part of U.S. application Ser. No. 15/976,307 filed May 10, 2018.

The U.S. application Ser. No. 16/046,243 is a continuation-in-part of U.S. application Ser. No. 14/846,987 filed Sep. 7, 2015, a continuation-in-part of U.S. application Ser. No. 15/080,427 filed Mar. 24, 2016, a continuation-in-part of U.S. application Ser. No. 15/605,920 filed May 25, 2017, a continuation-in-part of U.S. application Ser. No. 15/642,253 filed Jul. 5, 2017, a continuation-in-part of U.S. application Ser. No. 15/881,119 filed Jan. 26, 2018, a continuation-in-part of U.S. application Ser. No. 15/908,838 filed Mar. 1, 2018, and a continuation-in-part of U.S. application Ser. No. 15/976,307 filed May 10, 2018. The U.S. application Ser. No. 14/846,987 is a continuation-in-part of U.S. application Ser. No. 14/621,332 filed Feb. 12, 2015. The U.S. application Ser. No. 15/080,427 is a continuation-in-part of U.S. application Ser. No. 14/621,332 filed Feb. 12, 2015 and a continuation-in-part of U.S. application Ser. No. 14/846,987 filed Sep. 7, 2015. The U.S. application Ser. No. 15/605,920 is a continuation-in-part of U.S. application Ser. No. 14/621,332 filed Feb. 12, 2015 and a continuation-in-part of U.S. application Ser. No. 14/846,987 filed Sep. 7, 2015. The U.S. application Ser. No. 15/642,253 is a continuation-in-part of U.S. application Ser. No. 14/621,332 filed Feb. 12, 2015, and a continuation-in-part of U.S. application Ser. No. 14/846,987 filed Sep. 7, 2015. The U.S. application Ser. No. 15/785,426 is a continuation-in-part of U.S. application Ser. No. 15/642,253 filed Jul. 5, 2017 and a continuation-in-part of U.S. application Ser. No. 15/642,256 filed Jul. 5, 2017. The U.S. application Ser. No. 15/881,119 is a continuation-in-part of U.S. application Ser. No. 15/605,920 filed May 25, 2017, a continuation-in-part of U.S. application Ser. No. 14/621,332 filed Feb. 12, 2015 and a continuation-in-part of U.S. application Ser. No. 14/846,987 filed Sep. 7, 2015. The U.S. application Ser. No. 15/908,838 is a continuation-in-part of U.S. application Ser. No. 15/415,844 filed Jan. 25, 2017, a continuation-in-part of U.S. application Ser. No. 15/415,846 filed Jan. 25, 2017, a continuation-in-part of U.S. application Ser. No. 15/473,629 filed Mar. 30, 2017 and a continuation-in-part of U.S. application Ser. No. 15/642,253 filed Jul. 5, 2017. The U.S. application Ser. No. 15/976,307 is a division of pending U.S. patent application Ser. No. 14/621,332 filed Feb. 12, 2015.

The U.S. application Ser. No. 14/621,332 claims benefit of U.S. Provisional Application Ser. No. 61/949,652 filed Mar. 7, 2014. The U.S. application Ser. Nos. 15/415,844 and 15/415,846 are continuation-in-part of U.S. application Ser. No. 15/166,185 filed May 26, 2016, continuation-in-part of U.S. application Ser. No. 15/289,126 filed Oct. 8, 2016 and continuation-in-part of U.S. application Ser. No. 15/353,537 filed Nov. 16, 2016. The U.S. application Ser. No. 15/473,629 is a continuation-in-part of U.S. application Ser. No. 15/166,185 filed May 26, 2016, a continuation-in-part of U.S. application Ser. No. 15/289,126 filed Oct. 8, 2016, a continuation-in-part of U.S. application Ser. No. 15/353,537 filed Nov. 16, 2016, a continuation-in-part of U.S. application Ser. No. 15/415,844 filed Jan. 25, 2017, a continuation-in-part of U.S. application Ser. No. 15/415,846 filed Jan. 25, 2017 and a continuation-in-part of U.S. application Ser. No. 15/462,536 filed Mar. 17, 2017. The U.S. application Ser. No. 15/166,185 claims the priority benefit of U.S. Provisional Application Ser. No. 62/166,771 filed May 27, 2015. The U.S. application Ser. No. 15/289,126 is a continuation-in-part of U.S. application Ser. No. 15/166,185 filed May 26, 2016. The U.S. application Ser. No. 15/353,537 is a continuation-in-part of U.S. application Ser. No. 15/166,185 filed May 26, 2016 and a continuation-in-part of U.S. application Ser. No. 15/289,126 filed Oct. 8, 2016. The U.S. application Ser. No. 15/462,536 is a continuation-in-part of U.S. application Ser. No. 15/166,185 filed May 26, 2016, a continuation-in-part of U.S. application Ser. No. 15/289,126 filed Oct. 8, 2016 and a continuation-in-part of U.S. application Ser. No. 15/353,537 filed Nov. 16, 2016. The entirety of each of said Applications is incorporated herein by reference.

FIELD OF THE INVENTION

The present invention relates to a leadframe substrate and, more particularly, to a leadframe substrate having a modulator incorporated therein and a crack inhibiting structure over modulator/resin interfaces and a flip chip assembly using the same.

DESCRIPTION OF RELATED ART

High performance microprocessors and ASICs require high performance wiring board for signal interconnection. However, as the power increases, large amount of heat generated by semiconductor chip would degrade device performance and impose thermal stress on the chip. U.S. Pat. No. 8,859,908 to Wang et al., U.S. Pat. No. 8,415,780 to Sun, U.S. Pat. No. 9,185,791 to Wang and U.S. Pat. No. 9,706,639 to Lee disclose various package substrates in which a heat dissipation element is disposed in a through opening of a resin laminate so that the heat generated by semiconductor chip can be dissipated directly through the underneath heat dissipation element. As shown in FIG. 1, the heat dissipation element 12 is bonded to the surrounding resin laminate 14 typically through an adhesive 17 therebetween. However, as there is potentially significant coefficient of thermal expansion (CTE) mismatch between the heat dissipation element 12 and the resin laminate 14, the contact areas between the heat dissipation element 12 and the adhesive 17 are prone to crack. Under such a circumstance, the routing circuitries 19 must be disposed on the resin laminate portion of the substrates and semiconductor chip disposed on the heat dissipation element can only be connected to the resin laminate through bonding wires. These bonding wires electrically connect semiconductor chip I/O pad (not shown) to the routing circuitries on the resin laminate, and are spaced from the interfacial crack region to avoid electrical disconnection. Therefore, these substrates are not suitable for flip chip assemblies where routing circuitries must be disposed on the heat dissipation element, with extending across the interfacial boundary and onto the resin laminate portion.

In view of the various development stages and limitations in current substrates, fundamentally improving substrate's thermo-mechanical property for flip chip assembly is highly desirable.

SUMMARY OF THE INVENTION

A primary objective of the present invention is to provide a leadframe substrate having a high thermal conduction and low CTE modulator disposed therein. The modulator can not only provide effective heat dissipation pathway for chip assembled thereon, but also alleviate solder cracking defects caused by CTE mismatch between the flipped chip and substrate, thereby ensuring flip chip reliability.

Another objective of the present invention is to provide a leadframe substrate in which a crack inhibiting structure covers modulator/resin interfaces and laterally extends over the modulator and the resin layer. The crack inhibiting structure contains a continuous interlocking fiber sheet so that the segregation induced along the modulator/resin interfaces or cracks formed within the resin layer can be prevented or restrained from extending to the top surfaces. As a result, routing traces of the substrate and the signal integrity of the flip chip assembly can be ensured.

In accordance with the foregoing and other objectives, the present invention provides a leadframe substrate, comprising: a plurality of metal leads having top and bottom ends; a modulator having planar and parallel top and bottom sides, top contact pads at the top side thereof and bottom contact pads at the bottom side thereof, and being disposed in a designated location surrounded by the metal leads, wherein the modulator has a thermal conductivity higher than 10 W/mk and a coefficient of thermal expansion lower than 10 ppm/° C.; a resin layer that fills spaces between the metal leads and is attached to peripheral sidewalls of the modulator; and a first crack inhibiting structure including a first continuous interlocking fiber sheet that covers an interface between the modulator and the resin layer, and further laterally extends over and covers the top side of the modulator, the top ends of the metal leads and a top surface of the resin layer.

In another aspect, the present invention further provides a flip chip assembly, comprising: the aforementioned leadframe substrate; and a semiconductor chip electrically connected to the leadframe substrate through a plurality of bumps disposed in a space between the semiconductor chip and the leadframe substrate, wherein at least one of the bumps superimposed over the modulator and electrically connected to the metal leads through a first routing trace on the first crack inhibiting structure.

The leadframe substrate according to the present invention has numerous advantages. For instance, providing a low CTE modulator in the resin layer is particularly advantageous as the CTE of the modulator can match that of the semiconductor chip. Therefore, cracking of the interconnecting bumps associated with chip/substrate CTE-mismatch can be avoided. Additionally, providing the crack inhibiting structure that contains a continuous interlocking fiber sheet can offer protection to prevent segregation along the modulator/resin interface associated with CTE-mismatch between them, and the sheet can further restrain any crack formed within the resin layer from propagating to the substrate surface and damage top routing trace.

These and other features and advantages of the present invention will be further described and more readily apparent from the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE PREFERRED EMBODIMENTS

Hereafter, examples will be provided to illustrate the embodiments of the present invention. Advantages and effects of the invention will become more apparent from the following description of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Embodiment 1

FIGS. 2-11 are schematic views showing a method of making an untrimmed leadframe substrate that includes a metal frame, a plurality of metal leads, a modulator, a resin layer, a first crack inhibiting structure and a first routing trace in accordance with the first embodiment of the present invention.

Figure 1:
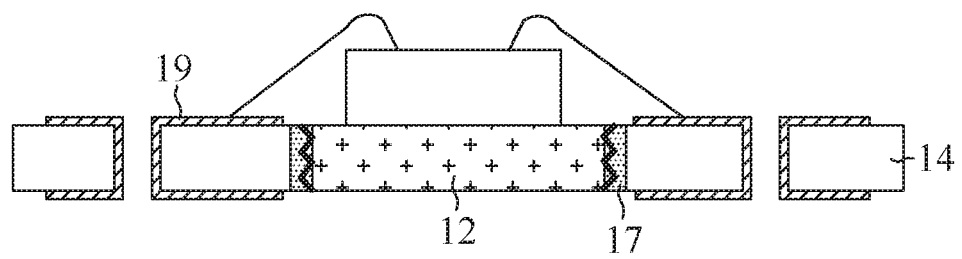
FIG. 1 is a cross-sectional view of a conventional wire bonding assembly.
Figure 2:
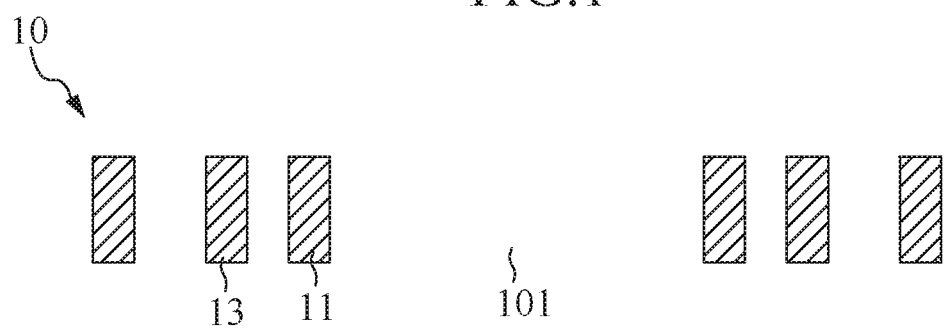
FIGS. 2 and 3 are cross-sectional and top perspective views, respectively, of a leadframe in accordance with the first embodiment of the present invention.
Figure 3:
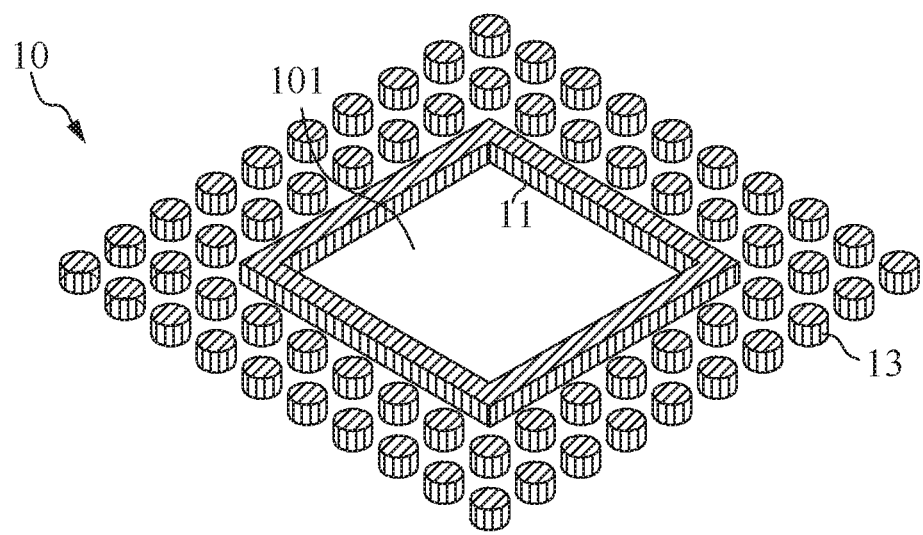

FIGS. 2 and 3 are cross-sectional and top perspective views, respectively, of a leadframe 10. The leadframe 10 typically is made of copper alloys, steel or alloy 42, and can be formed by wet etching or stamping/punching process from a rolled metal strip. The etching process may be a one-sided or two-sided etching to etch through the metal strip and thereby transfers the metal strip into a desired overall pattern of the leadframe 10. In this embodiment, the leadframe 10 has a uniform thickness in a range from about 0.15 mm to about 1.0 mm, and includes a metal frame 11 and a plurality of metal leads 13. The metal frame 11 has planar top and bottom surfaces and an aperture 101 and is surrounded by and spaced from the metal leads 13.

Figure 4:
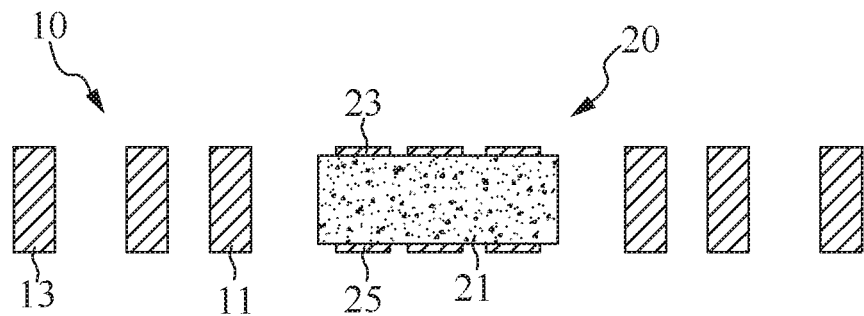
FIGS. 4 and 5 are cross-sectional and top perspective views, respectively, of the structure of FIGS. 2 and 3 further provided with a modulator in accordance with the first embodiment of the present invention.
Figure 5:
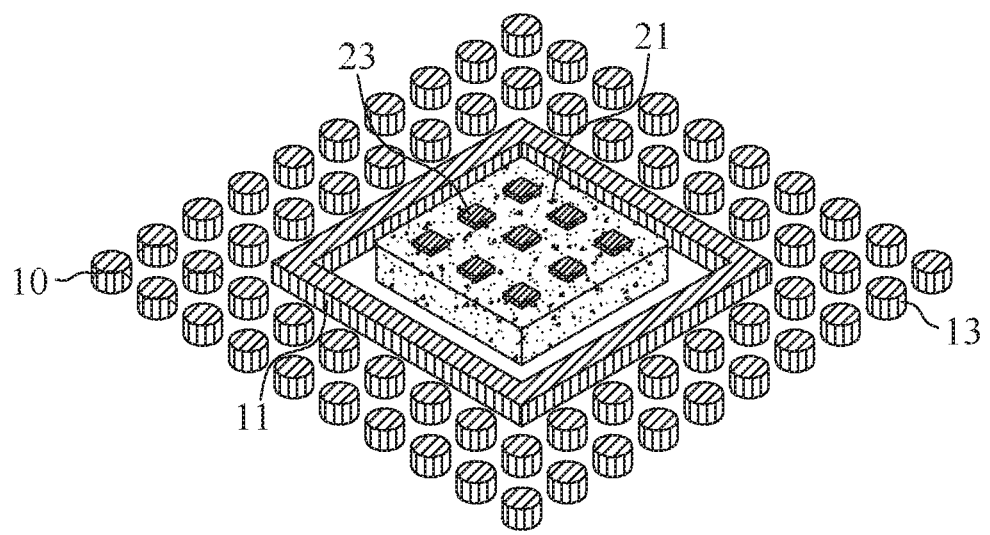

FIGS. 4 and 5 are cross-sectional and top perspective views, respectively, of the structure with a modulator 20 disposed at the designated location in the central area of the metal frame 11 and spaced from an inner sidewall of the metal frame 11. At this stage, the metal frame 11 can serve as an alignment guide for the modulator 20. In this illustration, the modulator 20 includes a thermally conductive and electrically insulating slug 21, top contact pads 23 at the top side, and bottom contact pads 25 at the bottom side. The modulator 20 typically has a thermal conductivity higher than 10 W/mk, an elastic modulus higher than 200 GPa, and a coefficient of thermal expansion lower than 10 ppm/° C. (for example, $2\times10^{-6}$ $K^{-1}$ to $10\times10^{-6}$ $K^{-1}$).

Figure 6:
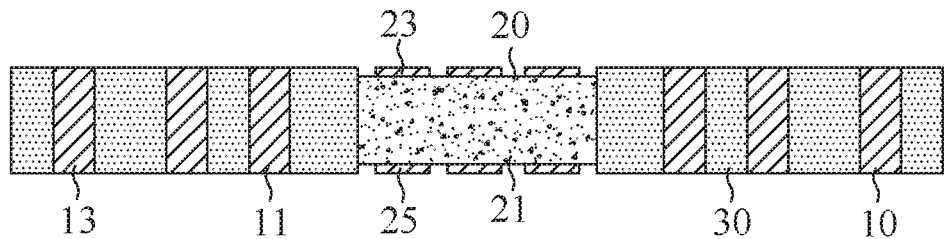
FIGS. 6 and 7 are cross-sectional and top perspective views, respectively, of the structure of FIGS. 4 and 5 further provided with a resin layer in accordance with the first embodiment of the present invention.
Figure 7:
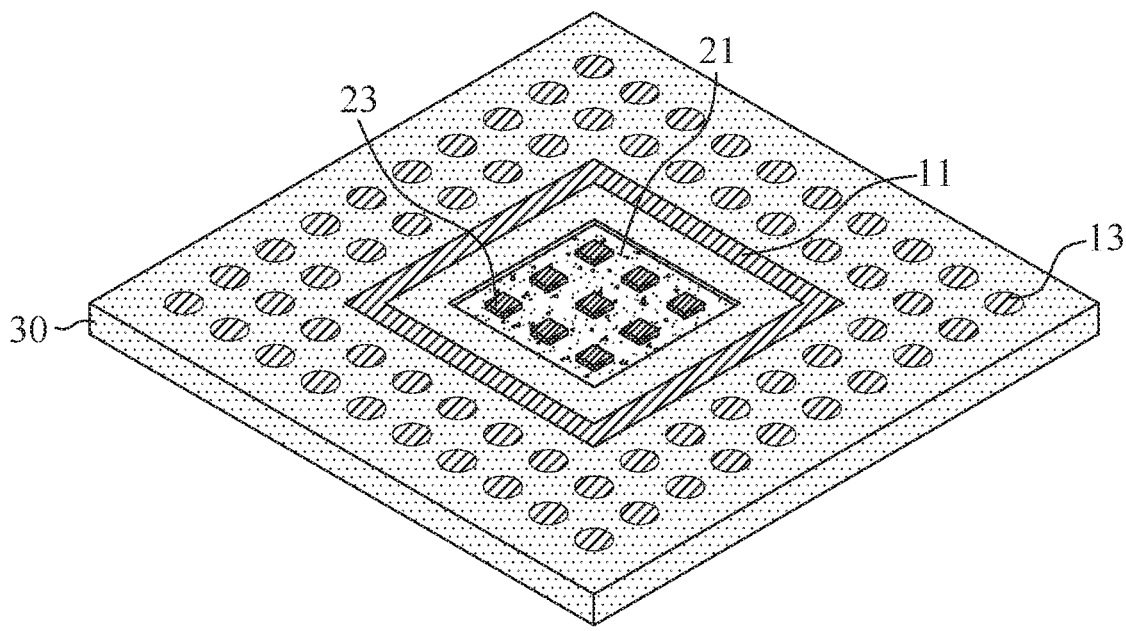

FIGS. 6 and 7 are cross-sectional and top perspective views, respectively, of the structure provided with a resin layer 30. The resin layer 30 can be deposited into the remaining spaces within the metal frame 11, and the spaces between the metal leads 13. At this stage, the metal frame 11 can prevent the modulator 20 from dislocation during resin layer disposition. The resin layer 30 typically has an elastic modulus lower than that of the modulator 20 or/and a coefficient of thermal expansion higher than that of the modulator 20. As a result, the resin layer 30 laterally covers and surrounds and conformally coats the metal leads 13 and the modulator 20 in lateral directions, and provides robust mechanical bonds between the leadframe 10 and the modulator 20. By planarization, the resin layer 30 has a top surface substantially coplanar with the top side of the leadframe 10 and the exterior surface of the top contact pads 23, and a bottom surface substantially coplanar with the bottom side of the leadframe 10 and the exterior surface of the bottom contact pads 25.

Figure 8:
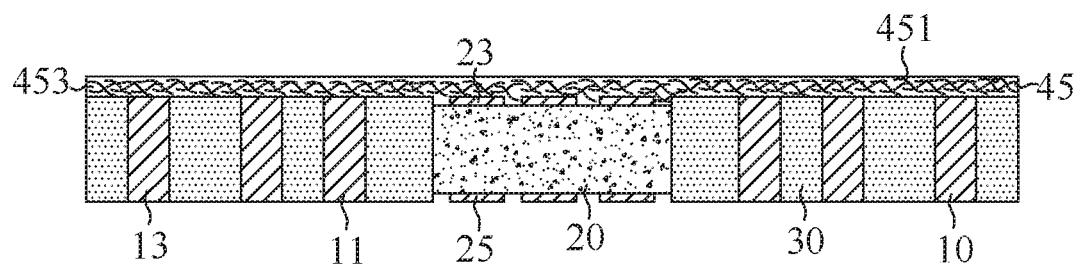
FIG. 8 is a cross-sectional view of the structure of FIG. 6 further provided with a first inhibiting structure in accordance with the first embodiment of the present invention.

FIG. 8 is a cross-sectional view of the structure with a first crack inhibiting structure 45 on the modulator 20 and the resin layer 30 as well as the leadframe 10 from above. The first crack inhibiting structure 45 covers the top surface of the metal frame 11, the top ends of the metal leads 13, the top side of the modulator 20, and the top surface of the resin layer 30 to provide protection from above. In this embodiment, the first crack inhibiting structure 45 includes a first continuous interlocking fiber sheet 451 that covers the interface between the modulator 20 and the resin layer 30 from above, and further laterally extends over and covers the top surface of the metal frame 11, the top side of the modulator 20, the top ends of the metal leads 13 and the top surface of the resin layer 30. The continuous interlocking fibers can be carbon fibers, silicon carbide fibers, glass fibers, nylon fibers, polyester fibers or polyamide fibers. Accordingly, even if cracks are formed within the resin layer 30 or generated at the interfaces between the modulator 20 and the resin layer 30 during thermal cycling, the fiber interlocking configuration formed in the first crack inhibiting structure 45 can restrain the cracks from extending into the first crack inhibiting structure 45 so as to ensure reliability of the routing trace on the first crack inhibiting structure 45. In this illustration, the first crack inhibiting structure 45 further includes a first binding matrix 453, and the first continuous interlocking fiber sheet 451 is impregnated in the first binding matrix 453.

Figure 9:
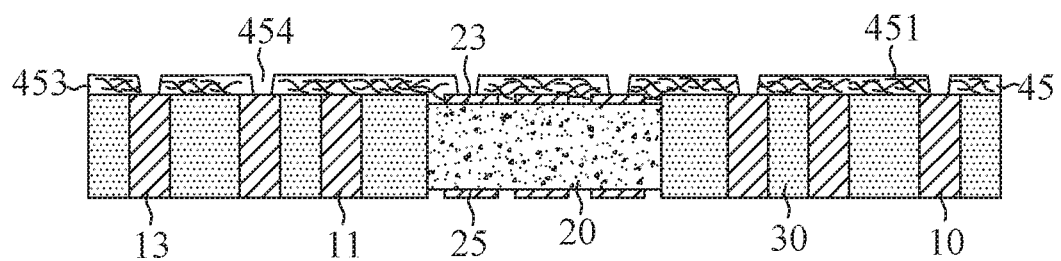
FIG. 9 is a cross-sectional view of the structure of FIG. 8 further provided with via openings in accordance with the first embodiment of the present invention.

FIG. 9 is a cross-sectional view of the structure with via openings 454 to expose the top ends of the metal leads 13 and the exterior surface of the top contact pads 23 and optionally the top surface of the metal frame 11 from above. The via openings 454 are formed by numerous techniques including laser drilling, plasma etching and photolithography, and typically have a diameter of 50 microns. Laser drilling can be enhanced by a pulsed laser. Alternatively, a scanning laser beam with a metal mask can be used. The via openings 454 extend through the first crack inhibiting structure 45, and are aligned with selected portions of the metal frame 11, selected portions of the metal leads 13 and selected portions of the top contact pads 23.

Figure 10:
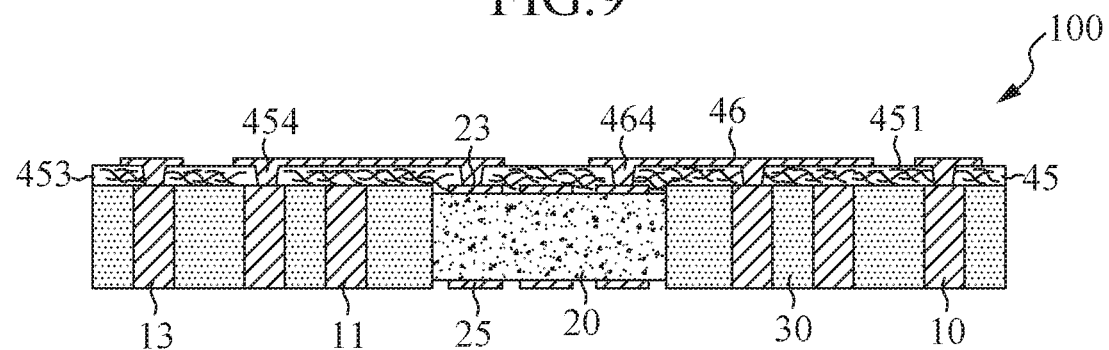
FIGS. 10 and 11 are cross-sectional and top perspective views, respectively, of the structure of FIG. 9 further provided with a first routing trace to finish the fabrication of a leadframe substrate in accordance with the first embodiment of the present invention.
Figure 11:
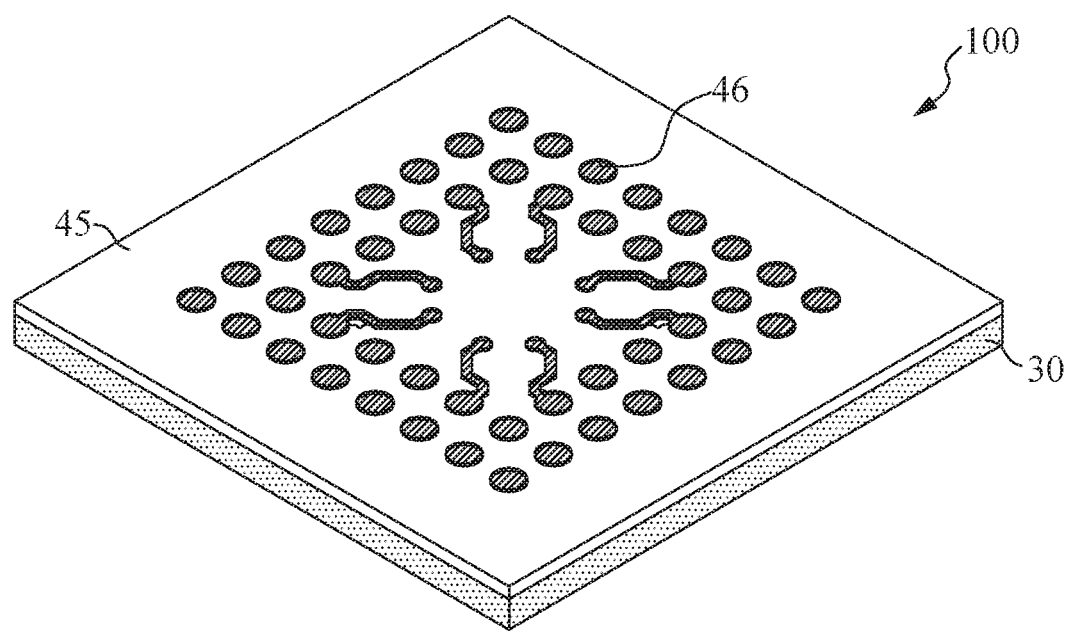

FIGS. 10 and 11 are cross-sectional and top perspective views, respectively, of the structure provided with a first routing trace 46 on the first crack inhibiting structure 45 by metal deposition and metal patterning process. The first routing trace 46 typically is made of copper and extends from the metal frame 11, the metal leads 13 and the top contact pads 23 of the modulator 20 in the upward direction, fills up the via openings 454 to form top metal vias 464 in direct contact with the metal frame 11, the metal leads 13 and the top contact pads 23, and extends laterally on the first crack inhibiting structure 45. As a result, the first routing trace 46 is attached to the first binding matrix 453 and thermally conductible to the metal frame 11 and the top contact pads 23 of the modulator 20 and electrically connected to the metal leads 13 through the top metal vias 464 penetrating through the first crack inhibiting structure 45.

At this stage, an untrimmed leadframe substrate 100 is accomplished and includes the metal frame 11, the metal leads 13, the modulator 20, the resin layer 30, the first crack inhibiting structure 45 and the first routing trace 46. The metal frame 11 laterally surrounds the modulator 20 and can serve as an alignment guide for the modulator 20 and provide thermal dissipation pathway. The metal leads 13 laterally surround the metal frame 11 and serve as vertical connection channels. The modulator 20 can function as a heat spreader for the substrate and help to maintain the flatness of the substrate when under external or internal strain/stress and thus ensure the reliability of the flip chip assembly. The resin layer 30 fills in spaces between the metal leads 13 and between the metal frame 11 and the modulator 20 and provides mechanical bonds between the leadframe 10 and the modulator 20. The first crack inhibiting structure 45 serves to prevent detachment occurring along modulator/resin interfaces and also serves as a crack stopper to restrain undesirable cracks formed in the resin layer 30 from extending to the first routing trace 46 so that the signal integrity of the flip chip assembly can be ensured. The first routing trace 46 provides horizontal routing in both the X and Y directions and is spaced from the modulator/resin interface by the first crack inhibiting structure 45.

Figure 12:
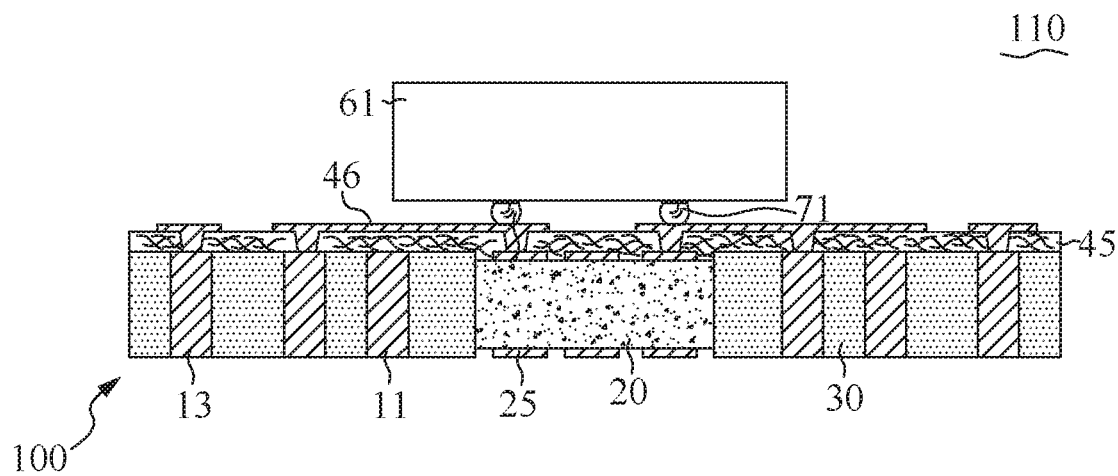
FIG. 12 is a cross-sectional view of a semiconductor assembly having a semiconductor chip electrically connected to the leadframe substrate of FIG. 10 in accordance with the first embodiment of the present invention.

FIG. 12 is a cross-sectional view of a semiconductor assembly 110 with a semiconductor chip 61 electrically connected to the leadframe substrate 100 illustrated in FIG. 10. The semiconductor chip 61, illustrated as a bare chip, is face-down mounted on the first routing trace 46 through bumps 71. As a result, the heat generated by the semiconductor chip 61 can be conducted away through the first routing trace 46, the modulator 20 and the metal frame 11. Additionally, the low CTE of the modulator 20 can reduce CTE mismatch between the semiconductor chip 61 and the bump attachment area covered by the modulator 20 from below and inhibit warpage in the bump attachment area during thermal cycling, so that the bumps 71 aligned with and completely covered by the modulator 20 from below will not suffer from cracking, thereby avoiding disconnection between the semiconductor chip 61 and the leadframe substrate 100.

Figure 13:
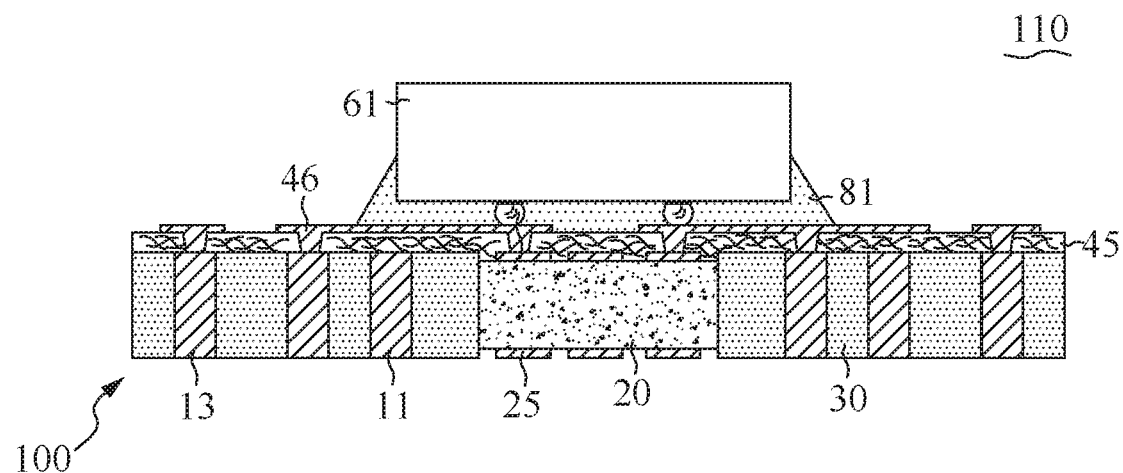
FIG. 13 is a cross-sectional view of the semiconductor assembly of FIG. 12 further provided with an underfill in accordance with the first embodiment of the present invention.

FIG. 13 is a cross-sectional view of the semiconductor assembly 110 of FIG. 12 further provided with an underfill 81. Optionally, the underfill 81 may be further provided to fill gaps between the semiconductor chip 61 and the interconnect substrate 100.

Figure 14:
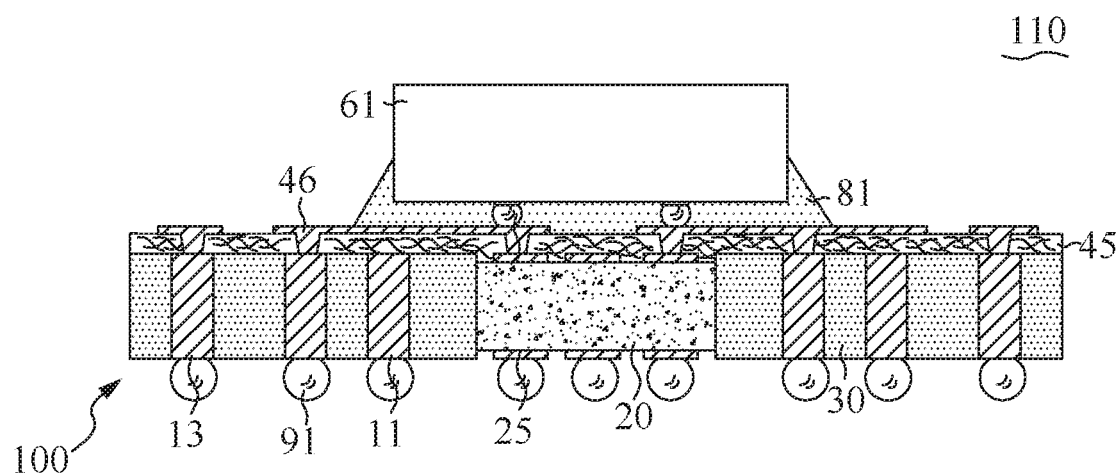
FIG. 14 is a cross-sectional view of the semiconductor assembly of FIG. 13 further provided with solder balls in accordance with the first embodiment of the present invention.

FIG. 14 is a cross-sectional view of the semiconductor assembly 110 of FIG. 13 further provided with solder balls 91. Optionally, the solder balls 91 may be further mounted on the bottom surface of the metal frame 11, the bottom ends of the metal leads 13 and the bottom contact pads 25 of the modulator 20 for next-level connection.

Figure 15:
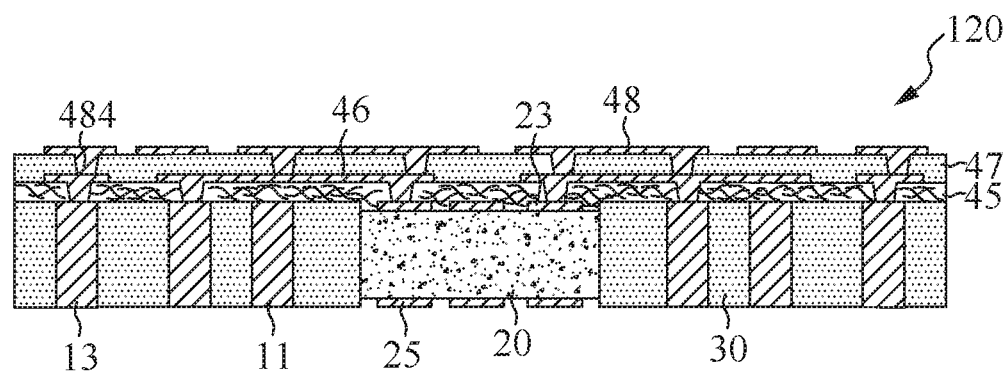
FIG. 15 is a cross-sectional view of another aspect of the leadframe substrate in accordance with the first embodiment of the present invention.

FIG. 15 is a cross-sectional view of another aspect of the leadframe substrate in accordance with the first embodiment. The leadframe substrate 120 is similar to that illustrated in FIG. 10, except that the leadframe substrate 120 further includes a first binding resin 47 and an exterior routing trace 48 formed in an alternate fashion from above. The first binding resin 47 covers the first crack inhibiting structure 45 and the first routing trace 46 from above. The exterior routing trace 48 laterally extends on the first binding resin 47 and contacts the first routing trace 46 through top metal vias 484 in the first binding resin 47. As a result, the exterior routing trace 48 is thermally conductible to the modulator 20 as well as the metal frame 11 and electrically connected to the metal leads 13 through the first routing trace 46.

Figure 16:
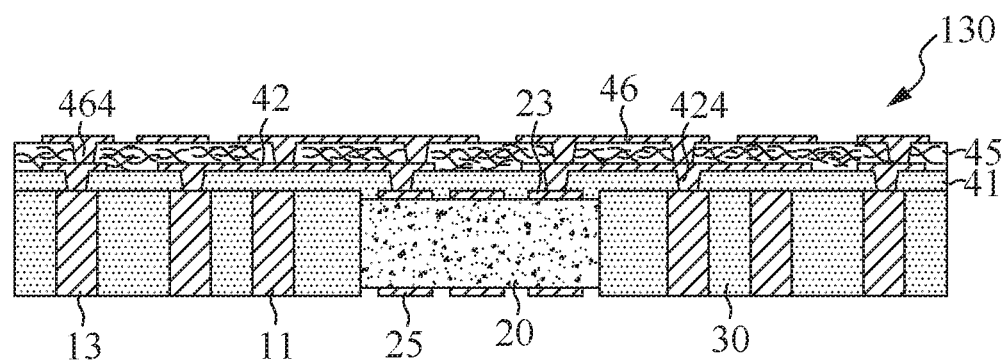
FIG. 16 is a cross-sectional view of yet another aspect of the leadframe substrate in accordance with the first embodiment of the present invention.

FIG. 16 is a cross-sectional view of yet another aspect of the leadframe substrate in accordance with the first embodiment. The leadframe substrate 130 is similar to that illustrated in FIG. 10, except that the leadframe substrate 130 further includes a first binding resin 41 and an interior routing trace 42 formed in an alternate fashion and located between the first crack inhibiting structure 45/the first routing trace 46 and the modulator 20/the resin layer 30. The first binding resin 41 covers and contacts the top surface of the metal frame 11, the top side of the modulator 20, the top ends of the metal leads 13 and the top surface of the resin layer 30. The interior routing trace 42 laterally extends on the first binding resin 41 and includes top metal vias 424 in contact with the top contact pads 23 and the metal leads 13 as well as the metal frame 11. The first crack inhibiting structure 45 covers the first binding resin 41 and the interior routing trace 42 from above and is spaced from the modulator 20 and the resin layer 30 by the first binding resin 41 and the interior routing trace 42. The first routing trace 46 laterally extends on the first crack inhibiting structure 45 and is thermally conductible to the top contact pads 23 of the modulator 20 as well as the metal frame 11 and electrically coupled to the metal leads 13 through top metal vias 464 in contact with the interior routing trace 42.

Embodiment 2

Figure 17:
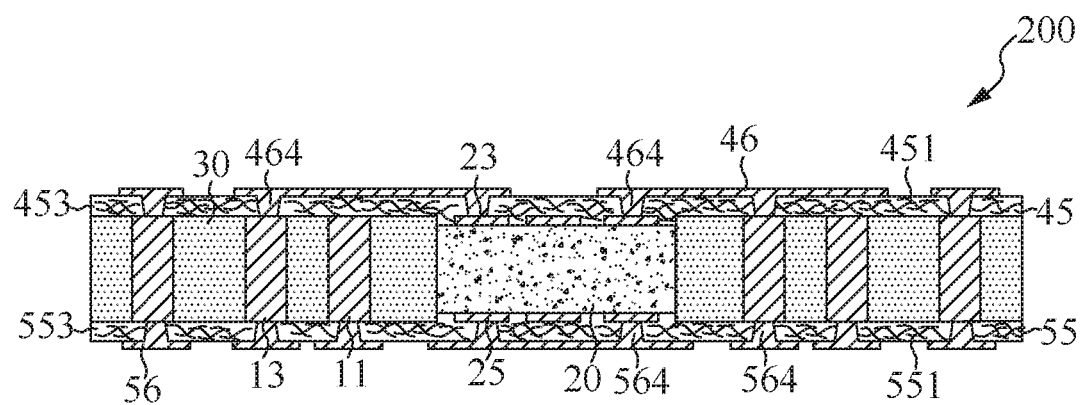
FIG. 17 is a cross-sectional view of a leadframe substrate in accordance with the second embodiment of the present invention.

FIG. 17 is a cross-sectional view of a leadframe substrate in accordance with the second embodiment of the present invention.

For purposes of brevity, any description in Embodiment 1 is incorporated herein insofar as the same is applicable, and the same description need not be repeated.

The leadframe substrate 200 is similar to that illustrated in FIG. 10, except that it further includes a second crack inhibiting structure 55 and a second routing trace 56 formed in an alternate fashion from below. The second crack inhibiting structure 55 covers the bottom surface of the metal frame 11, the bottom ends of the metal leads 13, the bottom side of the modulator 20, and the bottom surface of the resin layer 30 to provide protection from below. The second routing trace 56 extends laterally on the second crack inhibiting structure 55, and is thermally conductible to the bottom contact pads 25 of the modulator 20 as well as the metal frame 11 and electrically connected to the metal leads 13 through the bottom metal vias 564. Like the first crack inhibiting structure 45, the second crack inhibiting structure 55 may include a second continuous interlocking fiber sheet 551 that covers the interface between the modulator 20 and the resin layer 30 from below, and further laterally extends below and covers the bottom surface of the metal frame 11, the bottom side of the modulator 20, the bottom ends of the metal leads 13 and the bottom surface of the resin layer 30. Accordingly, the interlocking configuration formed in the second crack inhibiting structure 55 can restrain the cracks in the resin layer 30 from extending into the second crack inhibiting structure 55 so as to ensure reliability of the second routing trace 56 on the second crack inhibiting structure 55. By virtue of the dual protection from the first crack inhibiting structure 45 and the second crack inhibiting structure 55, the segregation induced by cracks formed along the modulator/resin interfaces or within the resin layer 30 can be prevented or restrained. In this illustration, the second crack inhibiting structure 55 further includes a second binding matrix 553, and the second continuous interlocking fiber sheet 551 is impregnated in the second binding matrix 553.

At this stage, an untrimmed leadframe substrate 200 is accomplished and includes the metal frame 11, the metal leads 13, the modulator 20, the resin layer 30, the first crack inhibiting structure 45, the first routing trace 46, the second crack inhibiting structure 55 and the second routing trace 56. The first crack inhibiting structure 45 and the second crack inhibiting structure 55 provides protection to ensure the reliability of the first routing trace 46 and the second routing trace 56. The first routing trace 46 is thermally conductible to the second routing trace 56 through the modulator 20 as well as the metal frame 11 for heat dissipation and is electrically connected to the second routing trace 56 through the metal leads 13 for signal transduction.

Figure 18:
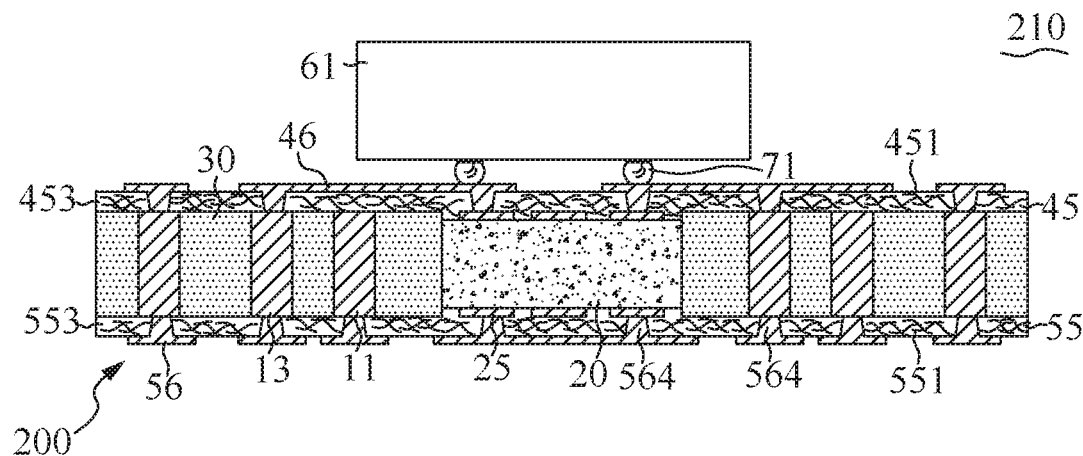
FIG. 18 is a cross-sectional view of a semiconductor assembly having a semiconductor chip electrically connected to the leadframe substrate of FIG. 17 in accordance with the second embodiment of the present invention.

FIG. 18 is a cross-sectional view of a semiconductor assembly 210 with a semiconductor chip 61 electrically connected to the leadframe substrate 200 illustrated in FIG. 17. The semiconductor chip 61 is face-down mounted on the first routing trace 46 through bumps 71. In this embodiment, the heat generated by the semiconductor chip 61 can be conducted away through the first routing trace 46, the modulator 20, the metal frame 11, and the second routing trace 56.

Figure 19:
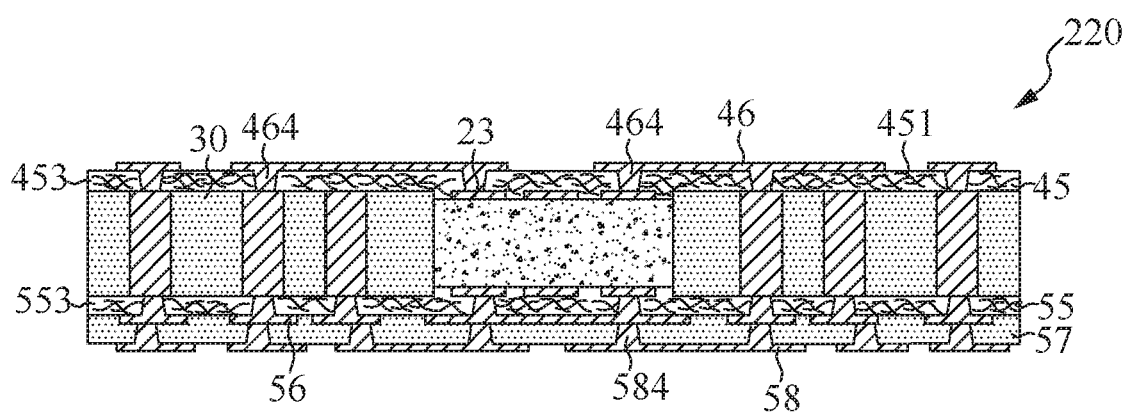
FIG. 19 is a cross-sectional view of another aspect of the leadframe substrate in accordance with the second embodiment of the present invention.

FIG. 19 is a cross-sectional view of another aspect of the leadframe substrate in accordance with the second embodiment. The leadframe substrate 220 is similar to that illustrated in FIG. 17, except that it further includes a second binding resin 57 and an exterior routing trace 58 formed in an alternate fashion from below. The second binding resin 57 covers the second crack inhibiting structure 55 and the second routing trace 56 from below. The exterior routing trace 58 laterally extends on the second binding resin 57 and includes bottom metal vias 584 in contact with the second routing trace 56. As a result, the first routing trace 46 is thermally conductible to the exterior routing trace 58 through the metal frame 11, the modulator 20 and the second routing trace 56 and electrically connected to the exterior routing trace 58 through the metal leads 13 and the second routing trace 56.

Figure 20:
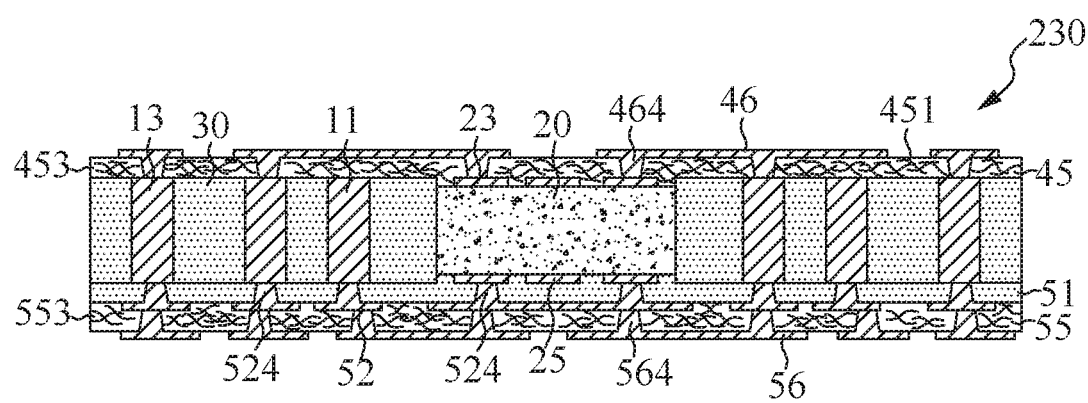
FIG. 20 is a cross-sectional view of yet another aspect of the leadframe substrate in accordance with the second embodiment of the present invention.

FIG. 20 is a cross-sectional view of yet another aspect of the leadframe substrate in accordance with the second embodiment. The leadframe substrate 230 is similar to that illustrated in FIG. 17, except that it further includes a second binding resin 51 and an interior routing trace 52 formed in an alternate fashion and located between the second crack inhibiting structure 55/the second routing trace 56 and the modulator 20/the resin layer 30. The second binding resin 51 covers and contacts the bottom surface of the metal frame 11, the bottom side of the modulator 20, the bottom ends of the metal leads 13 and the bottom surface of the resin layer 30. The interior routing trace 52 laterally extends on the second binding resin 51 and includes bottom metal vias 524 in contact with the metal frame 11, the metal leads 13 and the bottom contact pads 25 of the modulator 20. The second crack inhibiting structure 55 covers the second binding resin 51 and the interior routing trace 52 from below and is spaced from the modulator 20 and the resin layer 30 by the second binding resin 51 and the interior routing trace 52. The second routing trace 56 laterally extends on the second crack inhibiting structure 55 and is thermally conductible to the bottom contact pads 25 of the modulator 20 as well as the metal frame 11 and electrically coupled to the metal leads 13 through bottom metal vias 564 in contact with the interior routing trace 52.

Embodiment 3

Figure 21:
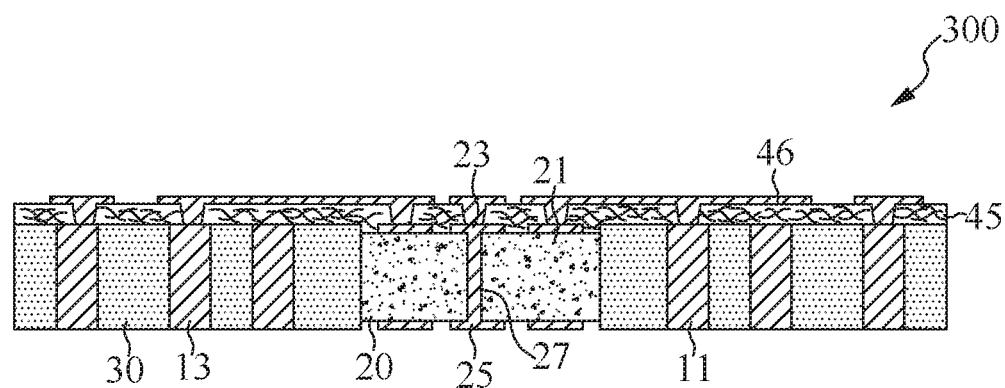
FIG. 21 is a cross-sectional view of a leadframe substrate in accordance with the third embodiment of the present invention.

FIG. 21 is a cross-sectional view of a leadframe substrate in accordance with the third embodiment of the present invention.

For purposes of brevity, any description in Embodiments above is incorporated herein insofar as the same is applicable, and the same description need not be repeated.

The leadframe substrate 300 is similar to that illustrated in FIG. 10, except that the modulator 20 further has metal through vias 27 in contact with the top contact pads 23 and the bottom contact pads 25. The metal through vias 27 extend through the thermally conductive and electrically insulating slug 21 to provide electrical connection between the top contact pads 23 and the bottom contact pads 25 for ground/power connection.

Figure 22:
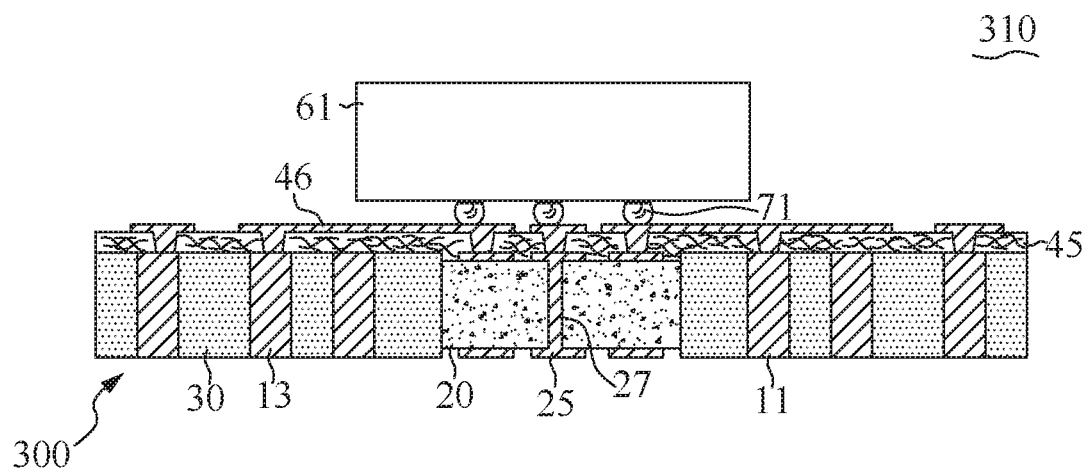
FIG. 22 is a cross-sectional view of a semiconductor assembly having a semiconductor chip electrically connected to the leadframe substrate of FIG. 21 in accordance with the third embodiment of the present invention.

FIG. 22 is a cross-sectional view of a semiconductor assembly 310 with a semiconductor chip 61 electrically connected to the leadframe substrate 300 illustrated in FIG. 21. The semiconductor chip 61 is face-down mounted to the first routing trace 46 through bumps 71. As a result, the semiconductor chip 61 is electrically connected to the metal leads 13 for signal transduction and to the modulator 20 for ground/power connection through the first routing trace 46.

Embodiment 4

Figure 23:
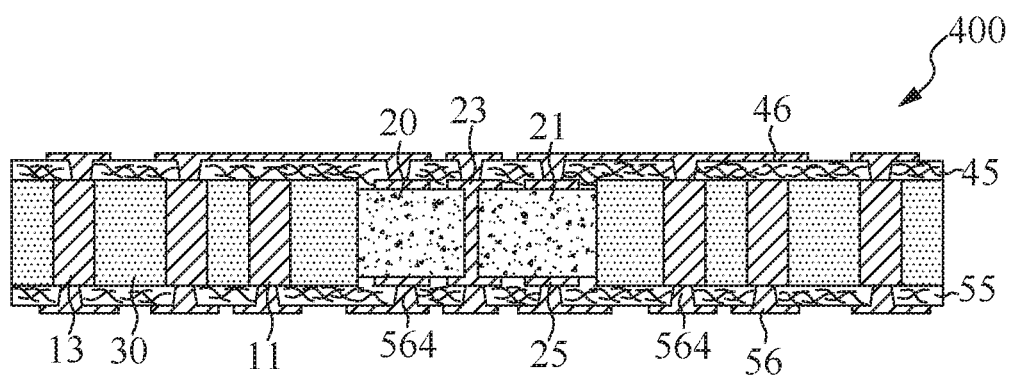
FIG. 23 is a cross-sectional view of a leadframe substrate in accordance with the fourth embodiment of the present invention.

FIG. 23 is a cross-sectional view of a leadframe substrate in accordance with the fourth embodiment of the present invention.

For purposes of brevity, any description in Embodiments above is incorporated herein insofar as the same is applicable, and the same description need not be repeated.

The leadframe substrate 400 is similar to that illustrated in FIG. 21, except that it further includes a second crack inhibiting structure 55 and a second routing trace 56 formed in an alternate fashion from below. The second crack inhibiting structure 55 covers the bottom surface of the metal frame 11, the bottom ends of the metal leads 13, the bottom side of the modulator 20, and the bottom surface of the resin layer 30. The second routing trace 56 extends laterally on the second crack inhibiting structure 55 and includes bottom metal vias 564 in contact with the metal frame 11, the metal leads 13 and the bottom contact pads 25. As a result, the second routing trace 56 is thermally conductible to and electrically coupled to the bottom contact pads 25 of the modulator 20 and the metal frame 11 for heat dissipation and ground/power connection and electrically coupled to the metal leads 13 for signal transduction.

Figure 24:
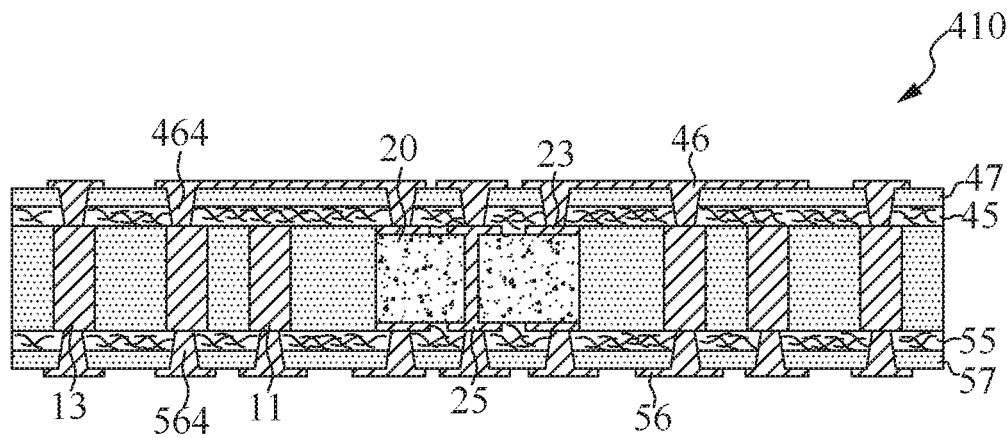
FIG. 24 is a cross-sectional view of another aspect of the leadframe substrate in accordance with the fourth embodiment of the present invention.

FIG. 24 is a cross-sectional view of another aspect of the leadframe substrate in accordance with the fourth embodiment. The leadframe substrate 410 is similar to that illustrated in FIG. 23, except that it further includes a first binding resin 47 between the first crack inhibiting structure 45 and the first routing trace 46 and a second binding resin 57 between the second crack inhibiting structure 55 and the second routing trace 56. The first routing trace 46 laterally extends on the first binding resin 47 and is electrically coupled to the metal frame 11, the top contact pads 23 of the modulator 20 and the top ends of the metal leads 13 through top metal vias 464 penetrating through the first crack inhibiting structure 45 and the first binding resin 47. The second routing trace 56 laterally extends on the second binding resin 57 and is electrically coupled to the metal frame 11, the bottom contact pads 25 of the modulator 20 and the bottom ends of the metal leads 13 through bottom metal vias 564 penetrating through the second crack inhibiting structure 55 and the second binding resin 57.

Figure 25:
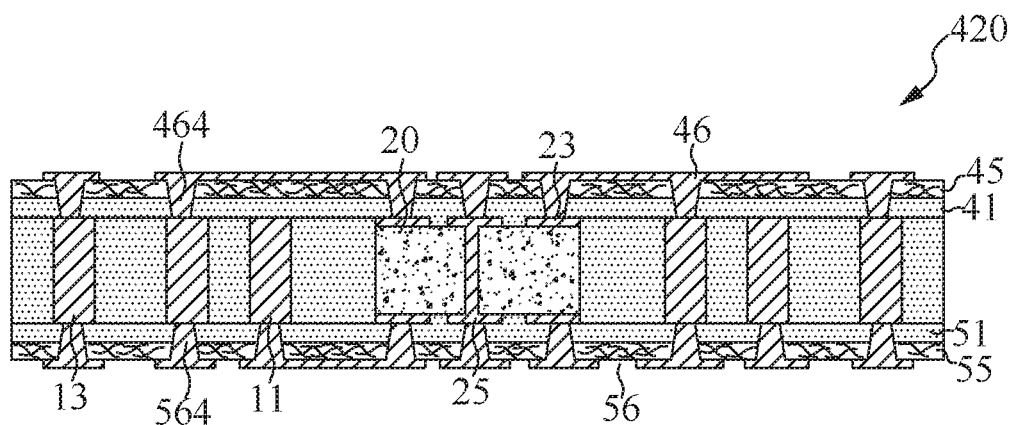
FIG. 25 is a cross-sectional view of yet another aspect of the leadframe substrate in accordance with the fourth embodiment of the present invention.

FIG. 25 is a cross-sectional view of yet another aspect of the leadframe substrate in accordance with the fourth embodiment. The leadframe substrate 420 is similar to that illustrated in FIG. 23, except that the first crack inhibiting structure 45 and the second crack inhibiting structure 55 are spaced from the modulator 20 and the resin layer 30 by a first binding resin 41 and a second binding resin 51, respectively. The first routing trace 46 laterally extends on the first crack inhibiting structure 45 and is electrically coupled to the metal frame 11, the top contact pads 23 of the modulator 20 and the top ends of the metal leads 13 through top metal vias 464 penetrating through the first binding resin 41 and the first crack inhibiting structure 46. The second routing trace 56 laterally extends on the second crack inhibiting structure 55 and is electrically coupled to the metal frame 11, the bottom contact pads 25 of the modulator 20 and the bottom ends of the metal leads 13 through bottom metal vias 564 penetrating through the second binding resin 51 and the second crack inhibiting structure 55.

Embodiment 5

Figure 26:
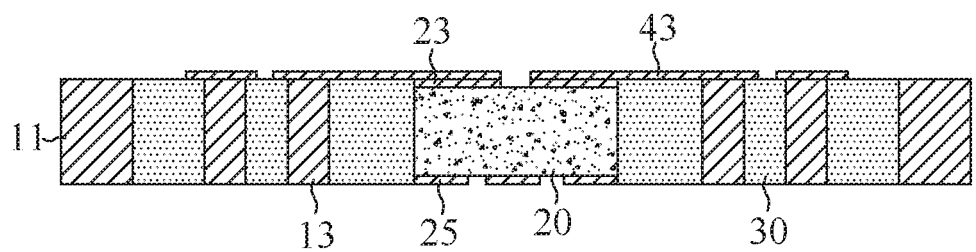
FIGS. 26 and 27 are cross-sectional and top perspective views, respectively, of the structure having a leadframe, a modulator, a resin layer and a first wiring layer in accordance with the fifth embodiment of the present invention.
Figure 27:
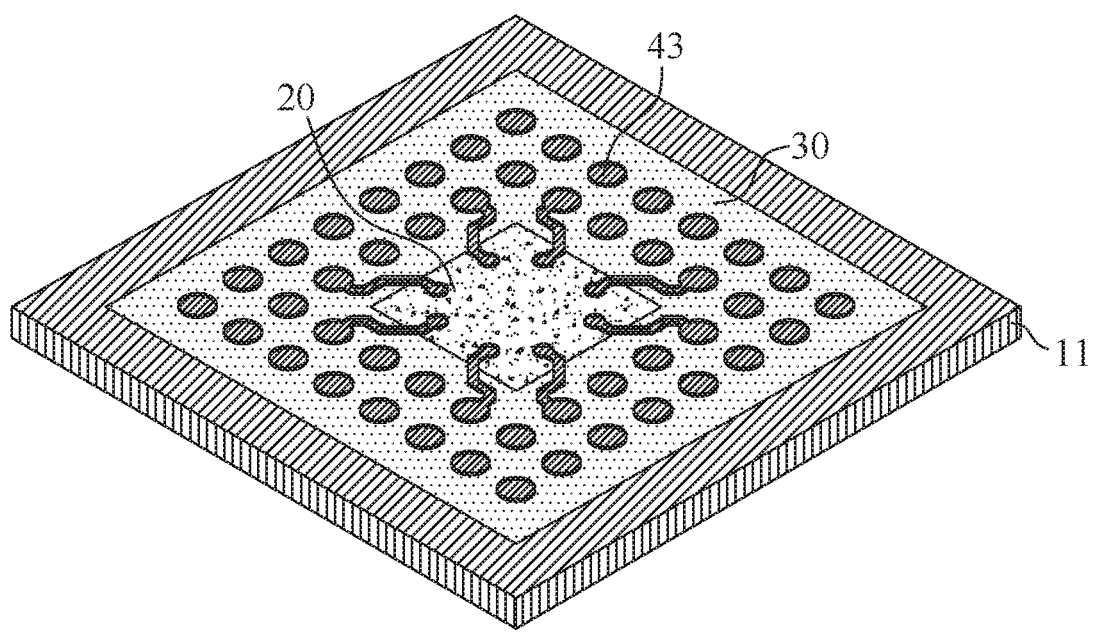
Figure 28:
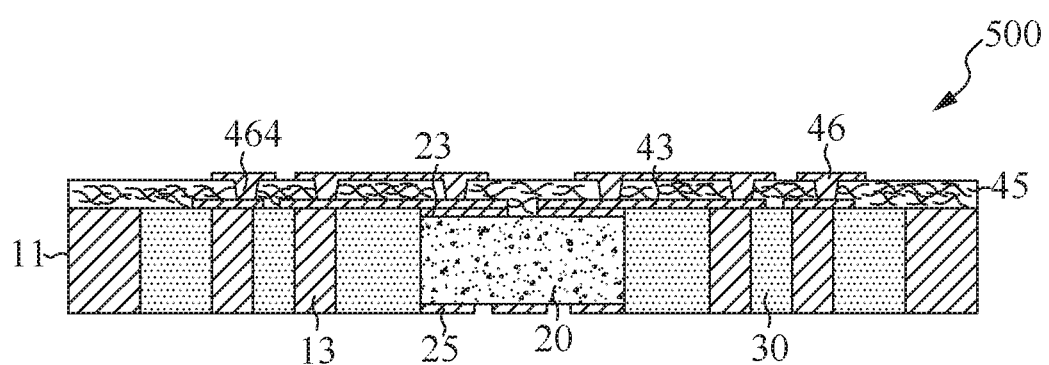
FIG. 28 is a cross-sectional view of the structure of FIG. 26 further provided with a first crack inhibiting structure and a first routing trace to finish the fabrication of a leadframe substrate in accordance with the fifth embodiment of the present invention.

FIGS. 26-28 are schematic views showing a method of making a leadframe substrate with a first wiring layer in accordance with the fifth embodiment of the present invention.

FIGS. 26 and 27 are cross-sectional and top perspective views, respectively, of the structure having a metal frame 11, a plurality of metal leads 13, a modulator 20, a resin layer 30 and a first wiring layer 43. The modulator 20 includes top contact pads 23 and bottom contact pads 25 at two opposite sides thereof. The metal leads 13 are located within and spaced from the metal frame 11 and laterally surround the modulator 20 to serve as vertical connection channels. The resin layer 30 binds peripheral sidewalls of the metal leads 13 and the modulator 20 to provide mechanical bonds between the metal leads 13 and the modulator 20. The first wiring layer 43 typically is made of copper and laterally extends on the top surface of the resin layer 30 and is electrically coupled to the metal lead 13 and thermally conductible to the top contact pads 23 of the modulator 20.

FIG. 28 is a cross-sectional view of the structure with a first crack inhibiting structure 45 and a first routing trace 46 formed in an alternate fashion from above. The first crack inhibiting structure 45 covers the modulator 20, the resin layer 30 and the first wiring layer 43 from above. The first routing trace 46 laterally extends on the first crack inhibiting structure 45 and is electrically connected to the metal leads 13 and thermally conductible to the modulator 20 through top metal vias 464 in contact with the first wiring layer 43.

Accordingly, an untrimmed leadframe substrate 500 is accomplished and includes the metal frame 11, the metal leads 13, the modulator 20, the resin layer 30, the first wiring layer 43, the first crack inhibiting structure 45 and the first routing trace 46.

Figure 29:
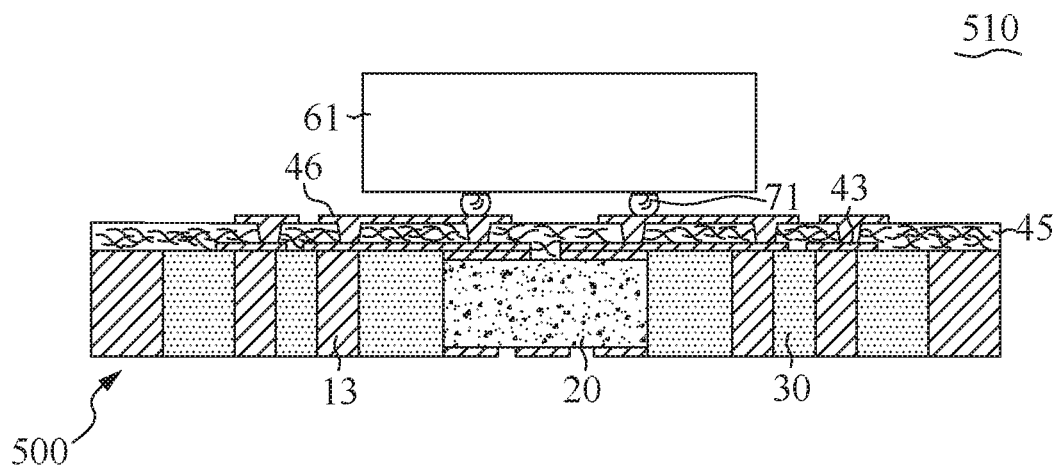
FIG. 29 is a cross-sectional view of a semiconductor assembly having a semiconductor chip electrically connected to the leadframe substrate of FIG. 28 in accordance with the fifth embodiment of the present invention.

FIG. 29 is a cross-sectional view of a semiconductor assembly 510 with a semiconductor chip 61 electrically connected to the leadframe substrate 500 illustrated in FIG. 28. The semiconductor chip 61 is flip-chip mounted on the first routing trace 46 through bumps 71 and electrically connected to the metal leads 13 through the first routing trace 46 and the first wiring layer 43.

Figure 30:
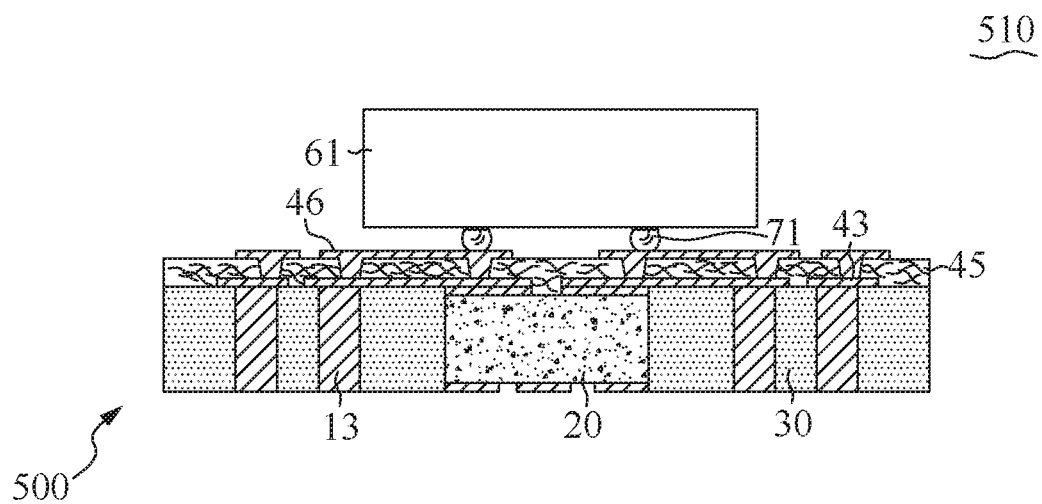
FIG. 30 is a cross-sectional view of the structure of FIG. 29 further subjected to a trimming process in accordance with the fifth embodiment of the present invention.

FIG. 30 is a cross-sectional view of the semiconductor assembly 510 of FIG. 29 after removal of the metal frame 11 as well as selected portions of the first crack inhibiting structure 45. The removal can be done by various methods including chemical etching, mechanical trimming/cutting or sawing to separate the metal frame 11 from the peripheral edge of the resin layer 30.

Embodiment 6

Figure 31:
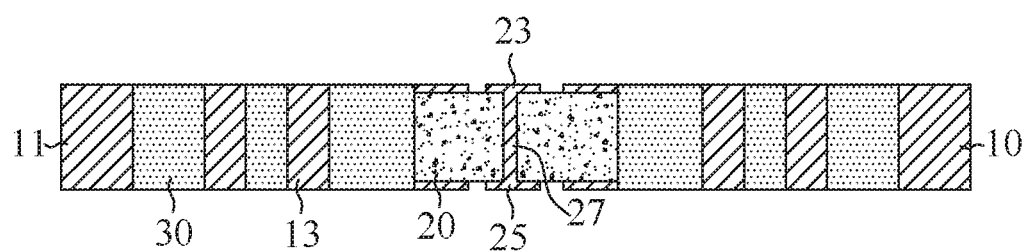
FIG. 31 is a cross-sectional view of the structure having a leadframe, a modulator and a resin layer in accordance with the sixth embodiment of the present invention.
Figure 32:
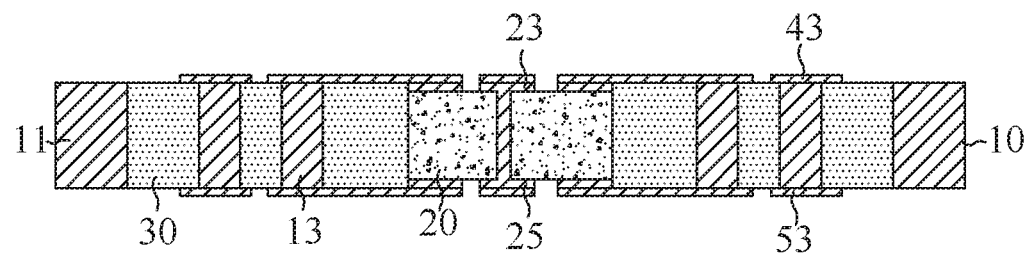
FIG. 32 is a cross-sectional view of the structure of FIG. 31 further provided with a first wiring layer and a second wiring layer in accordance with the sixth embodiment of the present invention.
Figure 33:
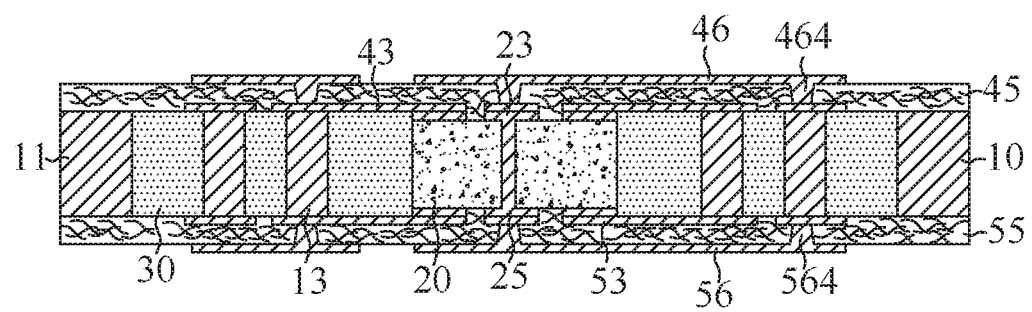
FIG. 33 is a cross-sectional view of the structure of FIG. 32 further provided with a first crack inhibiting structure, a first routing trace, a second crack inhibiting structure and a second routing trace to finish the fabrication of a leadframe substrate in accordance with the sixth embodiment of the present invention.

FIGS. 31-33 are schematic views showing a method of making a leadframe substrate with a first wiring layer and a second wiring layer in accordance with the sixth embodiment of the present invention.

FIG. 31 is a cross-sectional view of the structure with a modulator 20 bonded with a leadframe 10 by a resin layer 30. The modulator 20 is located with a metal frame 11 of the leadframe 10 and laterally surrounded by metal leads 13 of the leadframe 10. The resin layer 30 fills spaces between the metal leads 13 and is attached to peripheral sidewalls of the modulator 20. In this embodiment, the modulator 20 includes top contact pads 23 and bottom contact pads 25 located at two opposite sides thereof and electrically connected to each other by metal through vias 27.

FIG. 32 is a cross-sectional view of the structure with a first wiring layer 43 and a second wiring layer 53 on the top and bottom surfaces of the resin layer 30, respectively. The first wiring layer 43 laterally extends on the top surface of the resin layer 30 and is electrically coupled to the metal lead 13 and the top contact pads 23 of the modulator 20. The second wiring layer 53 laterally extends on the bottom surface of the resin layer 30 and is electrically coupled to the metal lead 13 and the bottom contact pads 25 of the modulator 20.

FIG. 33 is a cross-sectional view of the structure with a first crack inhibiting structure 45 and a first routing trace 46 formed in an alternate fashion from above and a second crack inhibiting structure 55 and a second routing trace 56 formed in an alternate fashion from below. The first crack inhibiting structure 45 covers the modulator 20, the resin layer 30 and the first wiring layer 43 from above. The second crack inhibiting structure 55 covers the modulator 20, the resin layer 30 and the second wiring layer 53 from below. The first routing trace 46 laterally extends on the first crack inhibiting structure 45 and is electrically connected to the metal leads 13 and the modulator 20 through top metal vias 464 in contact with the first wiring layer 43. The second routing trace 56 laterally extends on the second crack inhibiting structure 55 and is electrically connected to the metal leads 13 and the modulator 20 through bottom metal vias 564 in contact with the second wiring layer 53.

Accordingly, an untrimmed leadframe substrate 600 is accomplished and includes the metal frame 11, the metal leads 13, the modulator 20, the resin layer 30, the first wiring layer 43, the first crack inhibiting structure 45, the first routing trace 46, the second wiring layer 53, the second crack inhibiting structure 55 and the second routing trace 56.

Figure 34:
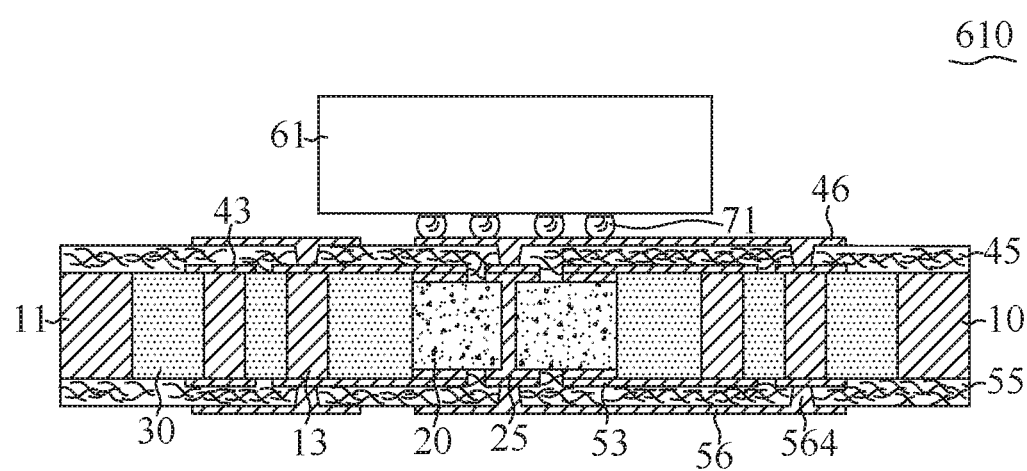
FIG. 34 is a cross-sectional view of a semiconductor assembly having a semiconductor chip electrically connected to the leadframe substrate of FIG. 33 in accordance with the sixth embodiment of the present invention.

FIG. 34 is a cross-sectional view of a semiconductor assembly 610 with a semiconductor chip 61 electrically connected to the leadframe substrate 600 illustrated in FIG. 33. The semiconductor chip 61 is flip-chip electrically connected to the first routing trace 46 through bumps 71. As a result, the semiconductor chip 61 is electrically connected to the second routing trace 56 through the first routing trace 46, the first wiring layer 43, the metal leads 13 and the second wiring layer 53, and the heat generated by the semiconductor chip 61 can be conducted away through the first routing trace 46, the first wiring layer 43, the modulator 20, the second wiring layer 53 and the second routing trace 56.

Embodiment 7

FIGS. 35-43 are schematic views showing a method of making a leadframe substrate with another type of leadframe in accordance with the seventh embodiment of the present invention.

Figure 35:
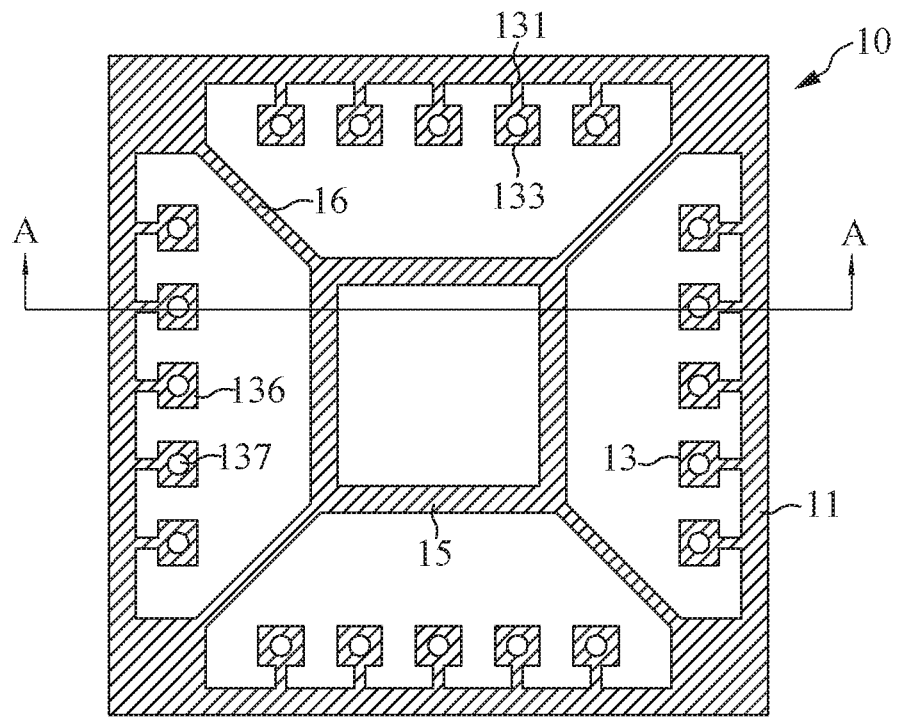
FIG. 35 is a top plan view of a leadframe in accordance with the seventh embodiment of the present invention.
Figure 36:
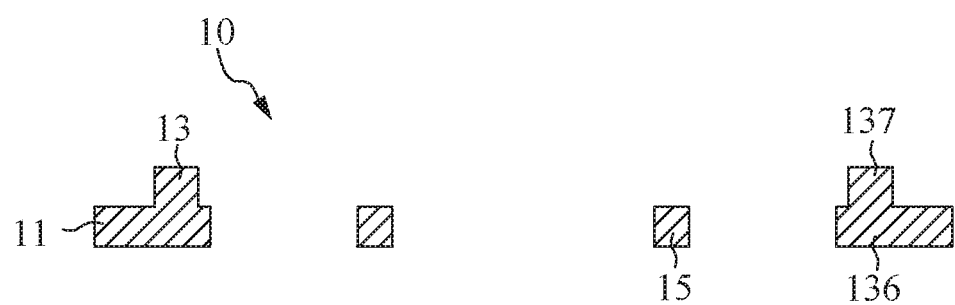
FIG. 36 is a cross-sectional view taken along the line A-A in FIG. 35.

FIGS. 35 and 36 are top plan and cross-sectional views, respectively, of a leadframe 10. The leadframe 10 includes an outer metal frame 11, a plurality of metal leads 13, an inner metal frame 15 and a plurality of tie bars 16. The metal leads 13 each have an outer end 131 integrally connected to the outer metal frame 11 and an inner end 133 directed inwardly away from the outer metal frame 11. The inner metal frame 15 surrounds the central area within the outer metal frame 11 and is connected to the outer metal frame 11 by the tie bars 16. In this embodiment, the leadframe 10 is further selectively half-etched from the top side thereof. As a result, the outer metal frame 11, the inner metal frame 15 and the tie bars 16 have reduced thickness, and the metal leads 13 have a stepped cross-sectional profile formed by a horizontally elongated portion 136 and a vertically projected portion 137. In this illustration, the vertically projected portion 137 protrudes from an upper surface of the horizontally elongated portion 136 in the upward direction.

Figure 37:
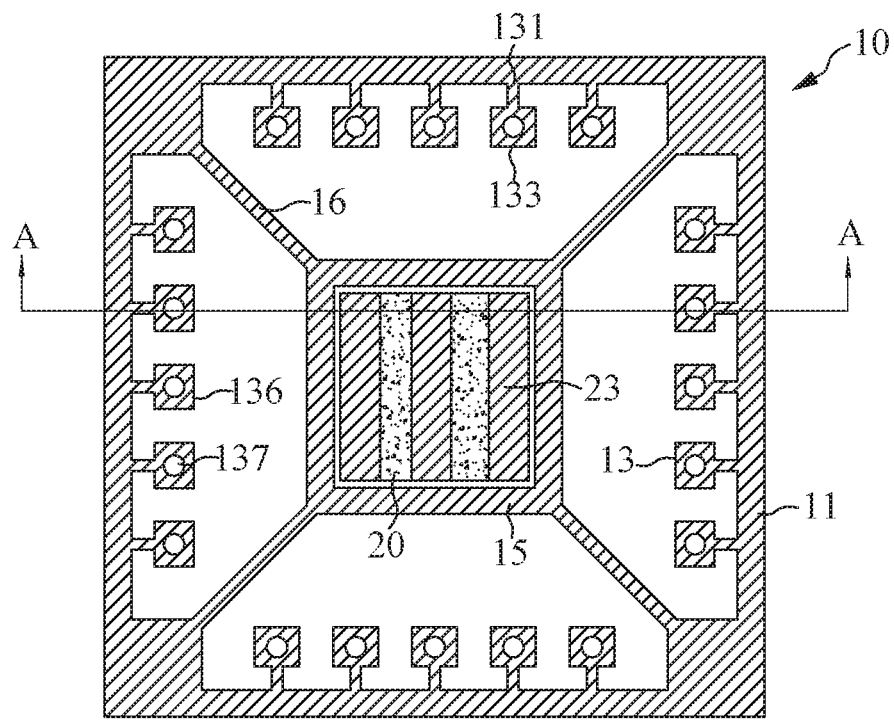
FIG. 37 is a top plan view of the structure of FIG. 35 further provided with a modulator in accordance with the seventh embodiment of the present invention.
Figure 38:
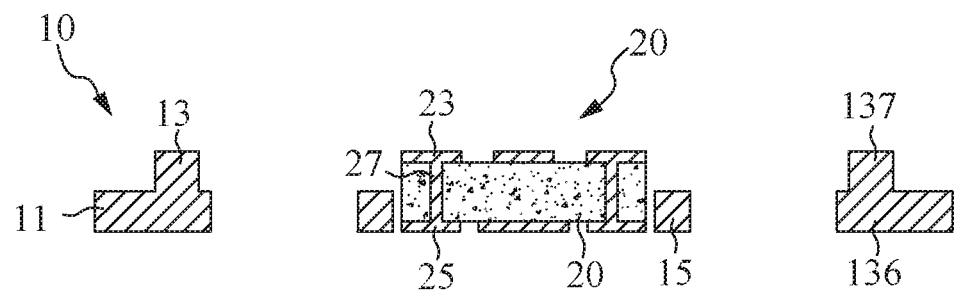
FIG. 38 is a cross-sectional view taken along the line A-A in FIG. 37.

FIGS. 37 and 38 are top plan and cross-sectional views, respectively, of the structure with a modulator 20 disposed at the central area within the inner metal frame 15. The placement accuracy of the modulator 20 is provided by the inner metal frame 15 in close proximity to peripheral sidewalls of the modulator 20. The thickness of the modulator 20 is larger than that of the outer metal frame 11, the inner metal frame 15 and the tie bars 16, and is substantially equal to the combined thickness of the horizontally elongated portion 136 and the vertically projected portion 137. In this embodiment, the thermally conductive 20 includes top contact pads 23 and bottom contact pads 25 located at two opposite sides thereof and electrically connected to each other by metal through vias 27.

Figure 39:
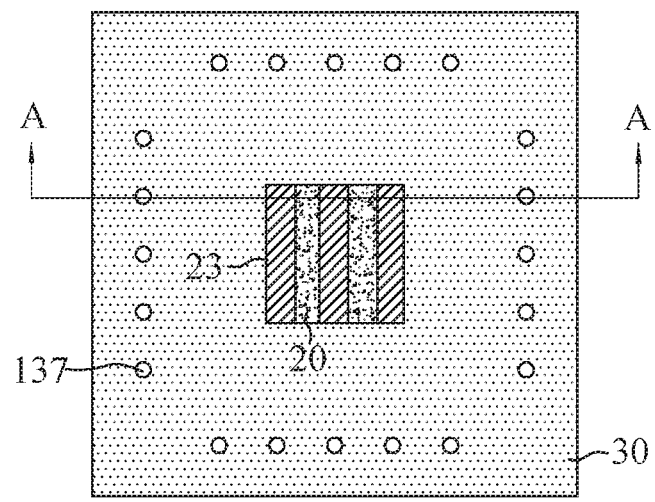
FIGS. 39 and 40 are top and bottom plan views, respectively, of the structure of FIG. 38 further provided with a resin layer in accordance with the seventh embodiment of the present invention.
Figure 40:
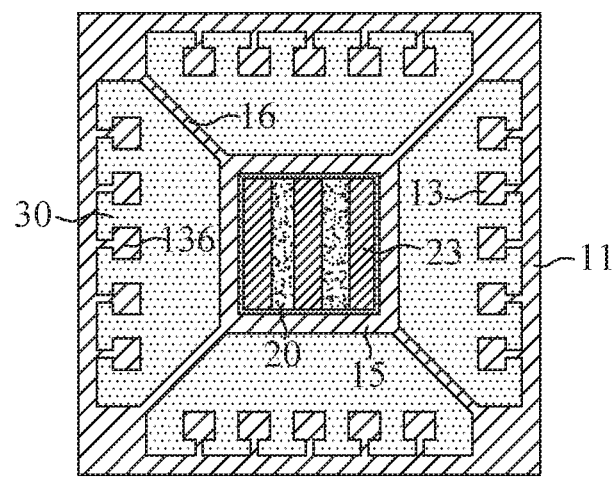
Figure 41:
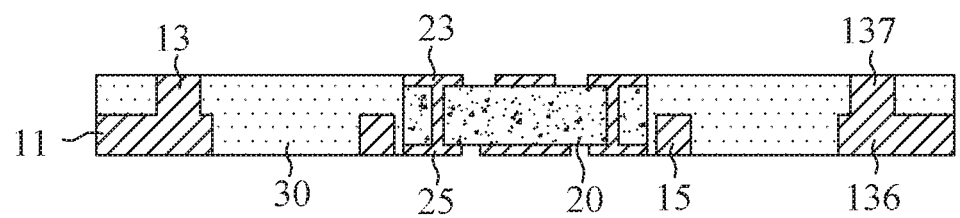
FIG. 41 is a cross-sectional view taken along the line A-A in FIG. 39.

FIGS. 39, 40 and 41 are top plan, bottom plan and cross-sectional views, respectively, of the structure provided with a resin layer 30. The resin layer 30 fills in spaces between the metal leads 13 and between the inner metal frame 15 and the modulator 20, and further covers the outer metal frame 11, the horizontally elongated portions 136 of the metal leads 13, the inner metal frame 15 and the tie bars 16 from above.

Figure 42:
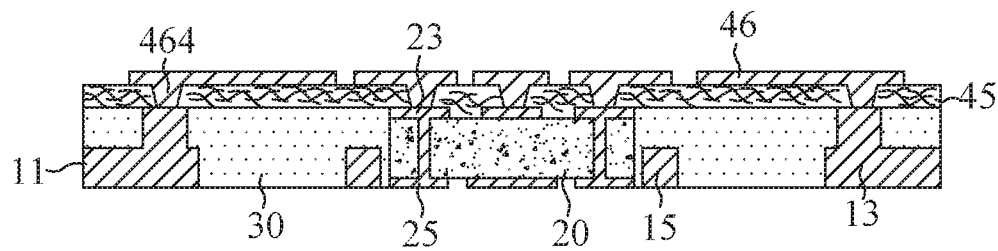
FIG. 42 is a cross-sectional view of the structure of FIG. 41 further provided with a first crack inhibiting structure and a first routing trace in accordance with the seventh embodiment of the present invention.

FIG. 42 is a cross-sectional view of the structure with a first crack inhibiting structure 45 and a first routing trace 46 formed in an alternate fashion from above. The first crack inhibiting structure 45 covers the metal leads 13, the modulator 20 and the resin layer 30 from above. The first routing trace 46 laterally extends on the first crack inhibiting structure 45 and is electrically connected to the metal leads 13 for signal transduction and to the top contact pads 23 of the modulator 20 for ground/power connection through top metal vias 464 in the first crack inhibiting structure 45.

Figure 43:
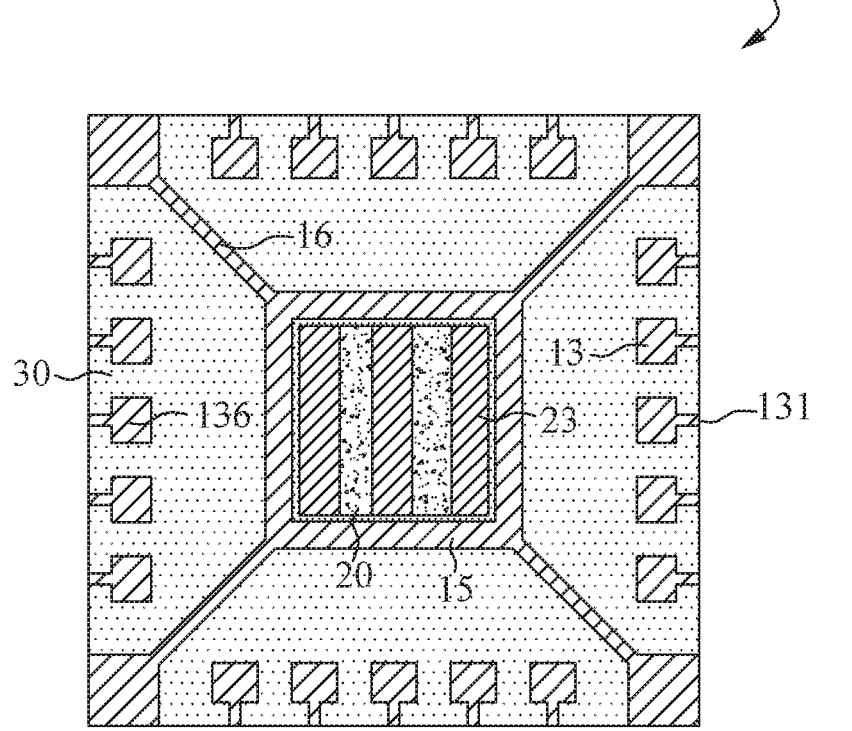
FIG. 43 is a bottom plan view of a leadframe substrate trimmed from the structure of FIG. 42 in accordance with the seventh embodiment of the present invention.

FIG. 43 is a bottom plan view of a leadframe substrate 700 separated from the outer metal frame 11. By cutting off the outer metal frame 11, the metal leads 13 are electrically isolated from each other and have outer ends 131 situated at peripheral edges of the leadframe substrate 700.

As illustrated in the aforementioned embodiments, a distinctive leadframe substrate is configured to have a modulator incorporated with a leadframe and a crack inhibiting structure over modulator/resin interfaces so as to exhibit improved reliability. In a preferred embodiment of the present invention, the leadframe substrate includes a modulator, a plurality of metal leads, a resin layer, a first crack inhibiting structure and a first routing trace. The leadframe substrate can be fabricated by steps of: providing a leadframe that includes a plurality of metal leads and further includes an inner metal frame and/or an outer metal frame, wherein the metal leads are located within the outer metal frame and laterally surround a predetermined area within the outer metal frame, or/and the metal leads are located outside of the inner metal frame and laterally surround the inner metal frame; disposing a modulator at the predetermined area within the outer/inner metal frame, wherein the modulator has top contact pads at a top side thereof and bottom contact pads at a bottom side thereof; providing a resin layer that covers peripheral sidewalls of the modulator and fills in spaces between the metal leads; forming a first crack inhibiting structure over the top side of the modulator, top ends of the metal leads and a top surface of the resin layer; and forming a first routing trace that laterally extends over the first crack inhibiting structure and is thermally conductible to the top contact pads of the modulator and electrically coupled to the top ends of the metal leads through top metal vias. After deposition of the resin layer, the outer metal frame can be removed. Optionally, the leadframe substrate of the present invention may further include a second crack inhibiting structure and a second routing trace by steps of: forming a second crack inhibiting structure under a bottom side of the modulator, bottom ends of the metal leads and a bottom surface of the resin layer; and forming a second routing trace that laterally extends under the second crack inhibiting structure and is thermally conductible to the bottom contact pads of the modulator and electrically coupled to the bottom ends of the metal leads through bottom metal vias.

Unless specifically indicated or using the term "then" between steps, or steps necessarily occurring in a certain order, the sequence of the above-mentioned steps is not limited to that set forth above and may be changed or reordered according to desired design.

The modulator is a non-electronic component and can function as a heat spreader and help to maintain the flatness of the substrate when under external or internal strain/stress. In a preferred embodiment, the modulator has a thermal conductivity higher than 10 W/mk, and includes a thermally conductive and electrically insulating slug, top contact pads on the top side of the thermally conductive and electrically insulating slug, and bottom contact pads on the bottom side of the thermally conductive and electrically insulating slug. In order to enhance the structural strength, the modulator typically has larger mechanical robustness than the resin layer. For example, compared to the epoxy elastic modulus of about 10 GPa for the resin layer, the modulator preferably has an elastic modulus higher than 200 GPa. Furthermore, the modulator preferably has a coefficient of thermal expansion lower than 10 ppm/° C. so as to reduce chip/substrate CTE mismatch. Specifically, as the low CTE of the modulator can reduce CTE mismatch between the chip and the pad disposition area covered by the modulator and inhibit warpage in the pad disposition area during thermal cycling, cracking of conductive joints (such as bumps) aligned with and completely covered by the modulator can be avoided. Optionally, the top contact pads and the bottom contact pads of the modulator may be electrically connected to each other. For instance, for ground/power connection, the modulator may further have metal through vias that extend through the thermally conductive and electrically insulating slug to provide electrical connection between the top contact pads and the bottom contact pads.

The metal leads can serve as signal vertical transduction pathways and optionally provide ground/power plane for power delivery and return. In a preferred embodiment, parts of the metal leads may be electrically connected to parts of the top contact pads of the modulator through a first wiring layer deposited on the top surface of the resin layer and in contact with the top contact pads and the top ends of the metal leads, or/and be electrically connected to parts of the bottom contact pads of the modulator through a second wiring layer deposited on the bottom surface of the resin layer and in contact with the bottom contact pads and the bottom ends of the metal leads. The first wiring layer and the second wiring layer are patterned metal layers and can enhance routing flexibility of the leadframe substrate.

The resin layer can be bonded to the modulator and the metal leads. By planarization, the top surface of the resin layer may be substantially coplanar with the exterior surface of the top contact pads of the modulator and the top ends of the metal leads, whereas the bottom surface of the resin layer may be substantially coplanar with the exterior surface of the bottom contact pads of the modulator and the bottom ends of the metal leads.

The first crack inhibiting structure and the second crack inhibiting structure are electrically insulating and can serve as crack stoppers to restrain undesirable cracks formed in the resin layer. In a preferred embodiment, the first crack inhibiting structure includes a first binding matrix and a first continuous interlocking fiber sheet impregnated in the first binding matrix, whereas the second crack inhibiting structure includes a second binding matrix and a second continuous interlocking fiber sheet impregnated in the second binding matrix. The first and second continuous interlocking fiber sheets cover top and bottom ends of the modulator/resin interfaces, respectively. By interlocking configuration of the first and second continuous interlocking fiber sheets, the cracks generated at modulator/resin interfaces or/and formed in the resin layer can be restrained from extending into the first and second crack inhibiting structures so as to ensure reliability of routing traces on the first and second crack inhibiting structures.

The first routing trace is a patterned metal layer laterally extending over the top side of the modulator and the top surface of the resin layer and spaced from the modulator/resin interfaces by the first crack inhibiting structure. By virtue of the first crack inhibiting structure between the first routing trace and the modulator/resin interfaces, the reliability of the first routing trace can be ensured. Likewise, the second routing trace is a patterned metal layer laterally extending under the bottom side of the modulator and the bottom surface of the resin layer and spaced from the modulator/resin interfaces by the second crack inhibiting structure to ensure the reliability of the second routing trace. In a preferred embodiment, the first routing trace is thermally conductible to the top contact pads of the modulator and electrically connected to the top ends of the metal leads through top metal vias, whereas the second routing trace is thermally conductible to the bottom contact pads of the modulator and electrically connected to the bottom ends of the metal leads through bottom metal vias.

The present invention also provides a semiconductor assembly in which a semiconductor chip is electrically connected to the aforementioned leadframe substrate through a wide variety of connection media including conductive bumps (such as gold or solder bumps). For instance, the semiconductor chip can be electrically connected to the first routing trace through a plurality of bumps aligned with and covered by the modulator. In a preferred embodiment, each of the bumps for chip connection is entirely positioned within the area completely covered by the modulator and does not laterally extend beyond peripheral edges of the modulator.

The assembly can be a first-level or second-level single-chip or multi-chip device. For instance, the assembly can be a first-level package that contains a single chip or multiple chips. Alternatively, the assembly can be a second-level module that contains a single package or multiple packages, and each package can contain a single chip or multiple chips. The semiconductor chip can be a packaged or unpackaged chip. Furthermore, the semiconductor chip can be a bare chip, or a wafer level packaged die, etc.

The term "cover" refers to incomplete or complete coverage in a vertical and/or lateral direction. For instance, in a preferred embodiment, the first crack inhibiting structure covers the top side of the modulator and the top surface of the resin layer as well as the modulator/resin interfaces regardless of whether another element (such as a first binding resin) is between the first crack inhibiting structure and the modulator and between the first crack inhibiting structure and the resin layer.

The phrases "mounted on", "attached on" and "attached to" include contact and non-contact with a single or multiple element(s). For instance, the first routing trace can be attached to the first binding matrix regardless of whether the first routing trace contacts the first binding matrix or is separated from the first binding matrix by a first binding resin.

The phrases "electrical connection", "electrically connected" and "electrically coupled" refer to direct and indirect electrical connection. For instance, in a preferred embodiment, the semiconductor chip can be electrically connected to the metal leads by the first routing trace but does not contact the metal leads.

The leadframe substrate made by this method is reliable, inexpensive and well-suited for high volume manufacture. The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

What is claimed is:

1. A leadframe substrate, comprising:
a plurality of metal leads having top and bottom ends;
a modulator having planar and parallel top and bottom sides, top contact pads at the top side thereof and bottom contact pads at the bottom side thereof, and being disposed in a designated location surrounded by the metal leads, wherein the modulator has a coefficient of thermal expansion less than 10 ppm/° C. and a thermal conductivity higher than 10 W/mk;
a resin layer that fills spaces between the metal leads and is attached to peripheral sidewalls of the modulator; and
a first crack inhibiting structure including a first continuous interlocking fiber sheet that covers an interface between the modulator and the resin layer, and further laterally extends over and covers the top side of the modulator, the top ends of the metal leads and a top surface of the resin layer.

2. The leadframe substrate of claim 1, wherein the first crack inhibiting structure further includes a first binding matrix, and the first continuous interlocking fiber sheet is impregnated in the first binding matrix.

3. The leadframe substrate of claim 2, further comprising a first routing trace that is attached to the first binding matrix and laterally extends over the modulator and the resin layer, wherein the first routing trace is spaced from the interface between the modulator and the resin layer by the first continuous interlocking fiber sheet and the first binding matrix, and is thermally conductible to the top contact pads of the modulator and electrically coupled to the metal leads by top metal vias penetrating through the first crack inhibiting structure.

4. The leadframe substrate of claim 3, further comprising a metal frame having planar top and bottom surfaces and an aperture, wherein the metal frame is surrounded by the metal leads, and the modulator is disposed within the aperture and spaced from an inner sidewall of the metal frame.

5. The leadframe substrate of claim 1, wherein the resin layer has a coefficient of thermal expansion higher than that of the modulator.

6. The leadframe substrate of claim 1, wherein the modulator has an elastic modulus higher than 200 GPa.

7. The leadframe substrate of claim 3, further comprising a second crack inhibiting structure that covers the bottom side of the modulator, the bottom ends of the metal leads and a bottom surface of the resin layer, wherein the second crack inhibiting structure includes a second continuous interlocking fiber sheet laterally extending over the interface between the modulator and the resin layer.

8. The leadframe substrate of claim 7, further comprising a second routing trace that laterally extends over the modulator and the resin layer, wherein the second routing trace is spaced from the interface between the modulator and the resin layer by the second crack inhibiting structure, and is thermally conductible to the bottom contact pads of the modulator and electrically coupled to the metal leads by bottom metal vias penetrating through the second crack inhibiting structure.

9. The leadframe substrate of claim 1, wherein the top contact pads are electrically coupled to the bottom contact pads of the modulator.

10. A flip chip assembly, comprising
the leadframe substrate of claim 3; and
a semiconductor chip electrically connected to the leadframe substrate through a plurality of bumps disposed in a space between the semiconductor chip and the leadframe substrate, wherein at least one of the bumps superimposed over the modulator and electrically connected to the metal leads through the first routing trace.

* * * * *